United States Patent
Khanna et al.

(10) Patent No.: US 11,483,658 B1
(45) Date of Patent: Oct. 25, 2022

(54) IN-EAR DETECTION OF WEARABLE DEVICES

(71) Applicant: Amazon Technologies, Inc., Seattle, WA (US)

(72) Inventors: Varn Khanna, Vallejo, CA (US); Atif M Noori, San Mateo, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/114,838

(22) Filed: Dec. 8, 2020

Related U.S. Application Data

(60) Provisional application No. 63/077,785, filed on Sep. 14, 2020.

(51) Int. Cl.
| | |
|---|---|
| *H04R 5/04* | (2006.01) |
| *H04R 1/10* | (2006.01) |
| *H04R 29/00* | (2006.01) |
| *H03K 17/96* | (2006.01) |
| *G01P 15/08* | (2006.01) |
| *G01S 17/04* | (2020.01) |

(52) U.S. Cl.
CPC ............... *H04R 5/04* (2013.01); *G01P 15/08* (2013.01); *G01S 17/04* (2020.01); *H03K 17/962* (2013.01); *H04R 1/1016* (2013.01); *H04R 1/1041* (2013.01); *H04R 29/001* (2013.01); *H04R 2201/109* (2013.01); *H04R 2499/11* (2013.01)

(58) Field of Classification Search
CPC ...... H04R 5/04; H04R 1/1016; H04R 1/1041; H04R 29/001; H04R 2201/109; H04R 499/11; G01S 17/04; G01P 15/08; H03K 17/962
USPC ................. 381/150, 151, 309, 311, 312, 370
See application file for complete search history.

(56) References Cited

U.S. PATENT DOCUMENTS

| | | | | |
|---|---|---|---|---|
| 10,291,975 B2 * | 5/2019 | Howell | ................ | H04R 29/001 |
| 2010/0020982 A1 * | 1/2010 | Brown | ................ | H04R 1/1041 381/74 |
| 2013/0279724 A1 * | 10/2013 | Stafford | ............... | H04R 1/1041 381/74 |
| 2018/0070166 A1 * | 3/2018 | Howell | ................ | H04R 29/001 |

* cited by examiner

*Primary Examiner* — William A Jerez Lora
(74) *Attorney, Agent, or Firm* — Pierce Atwood LLP

(57) ABSTRACT

A system and method for determining an in-ear status of wearable audio devices includes determining that the devices are each proximate a portion of a body of a user. Each device determines its orientation; if both orientations correspond to ears of the user, the devices output corresponding audio.

18 Claims, 20 Drawing Sheets

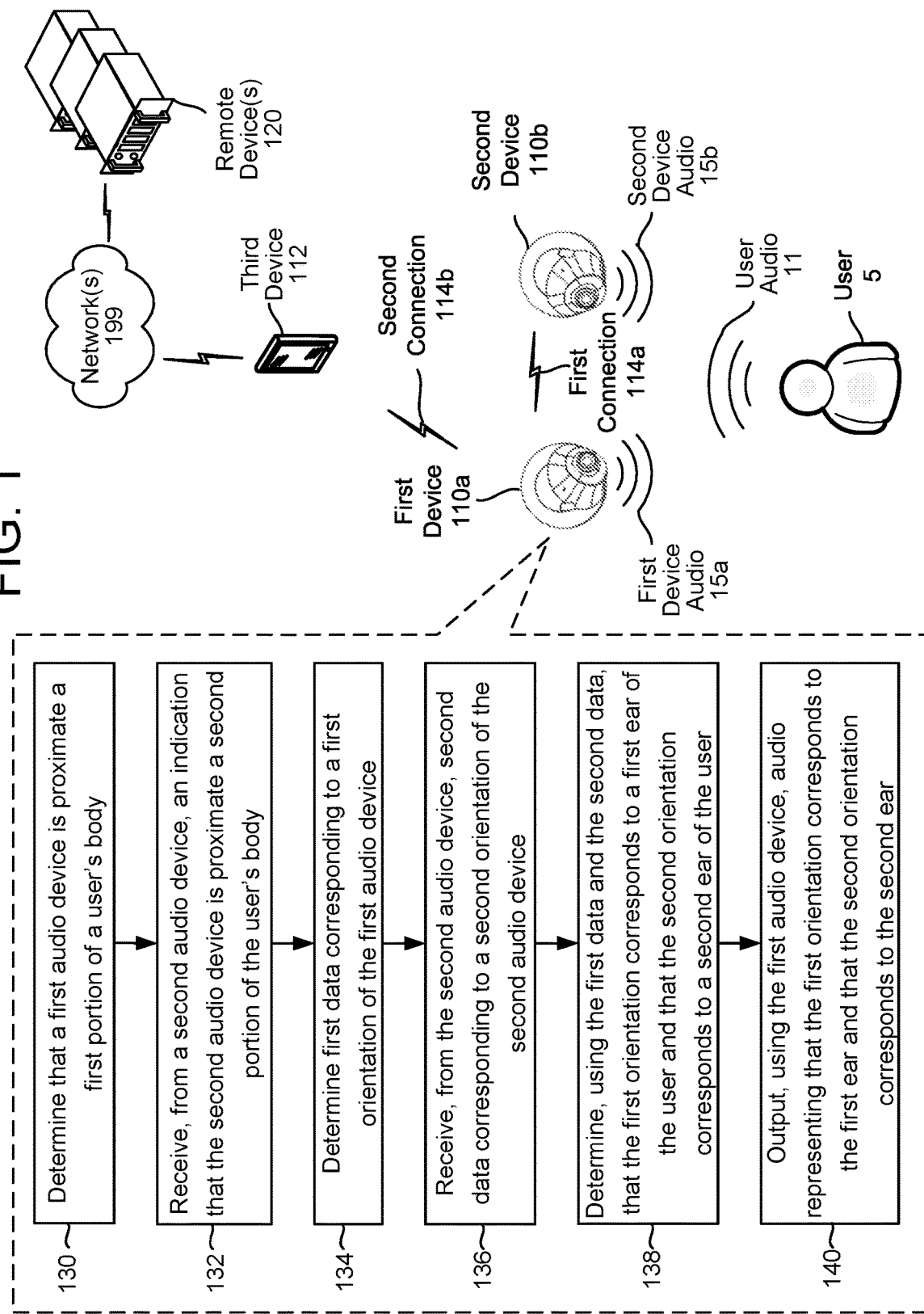

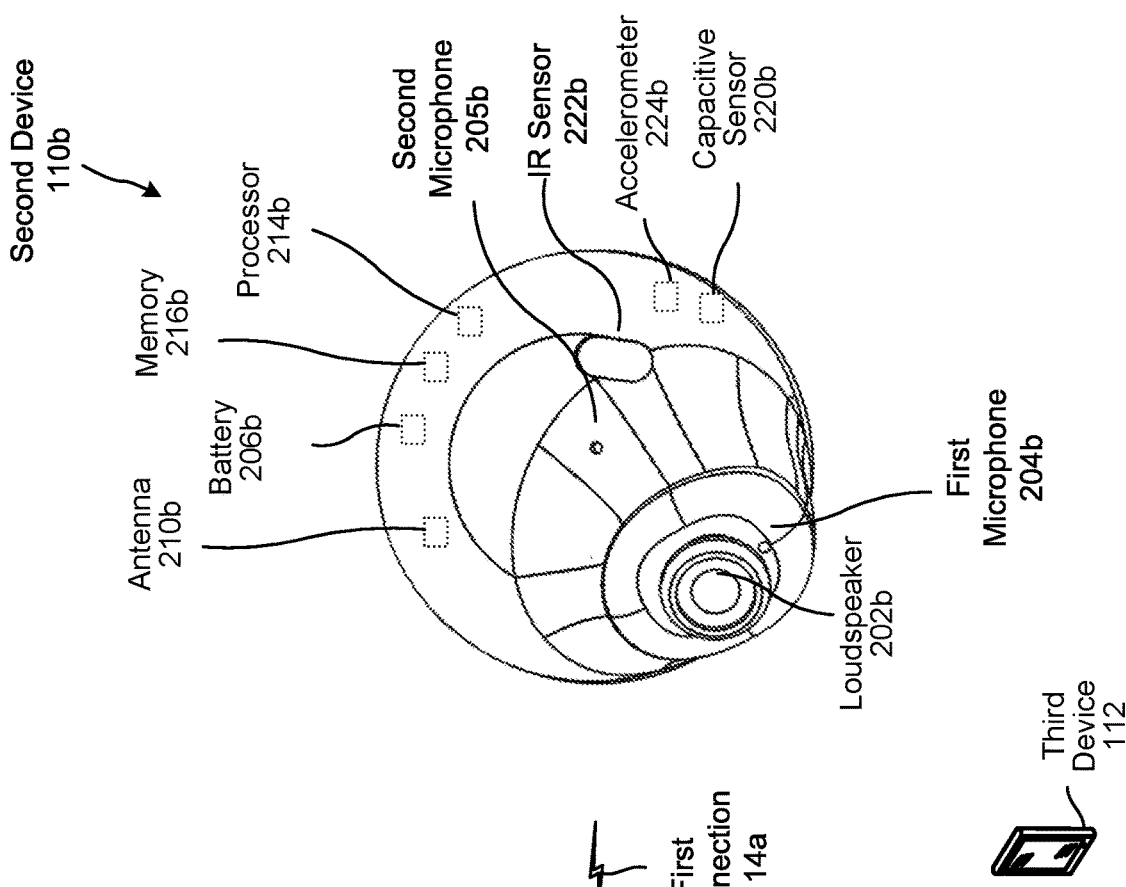
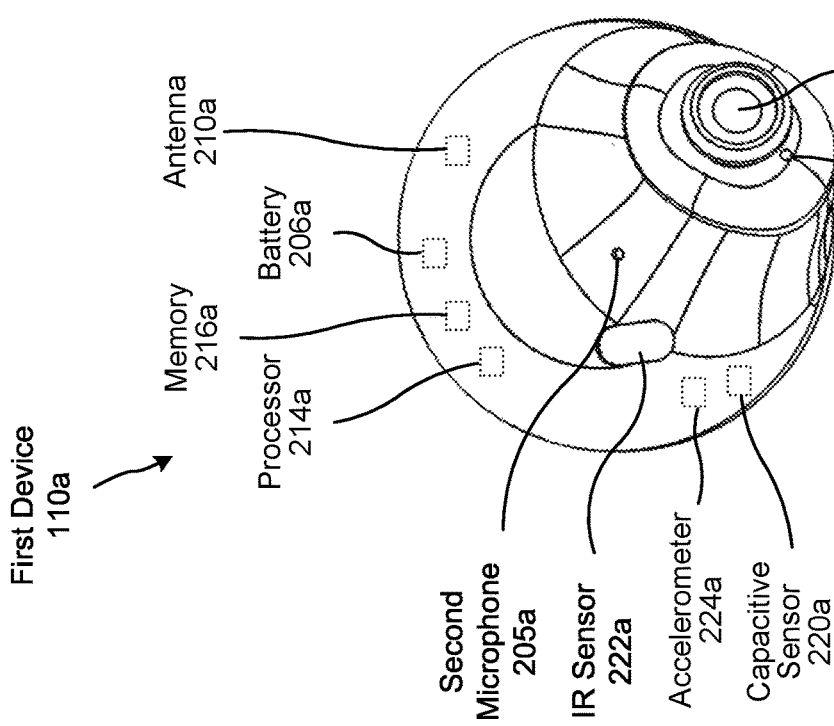
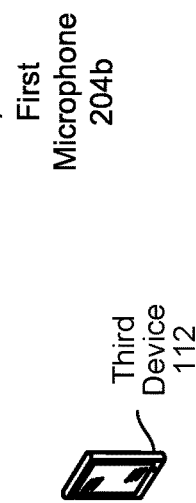

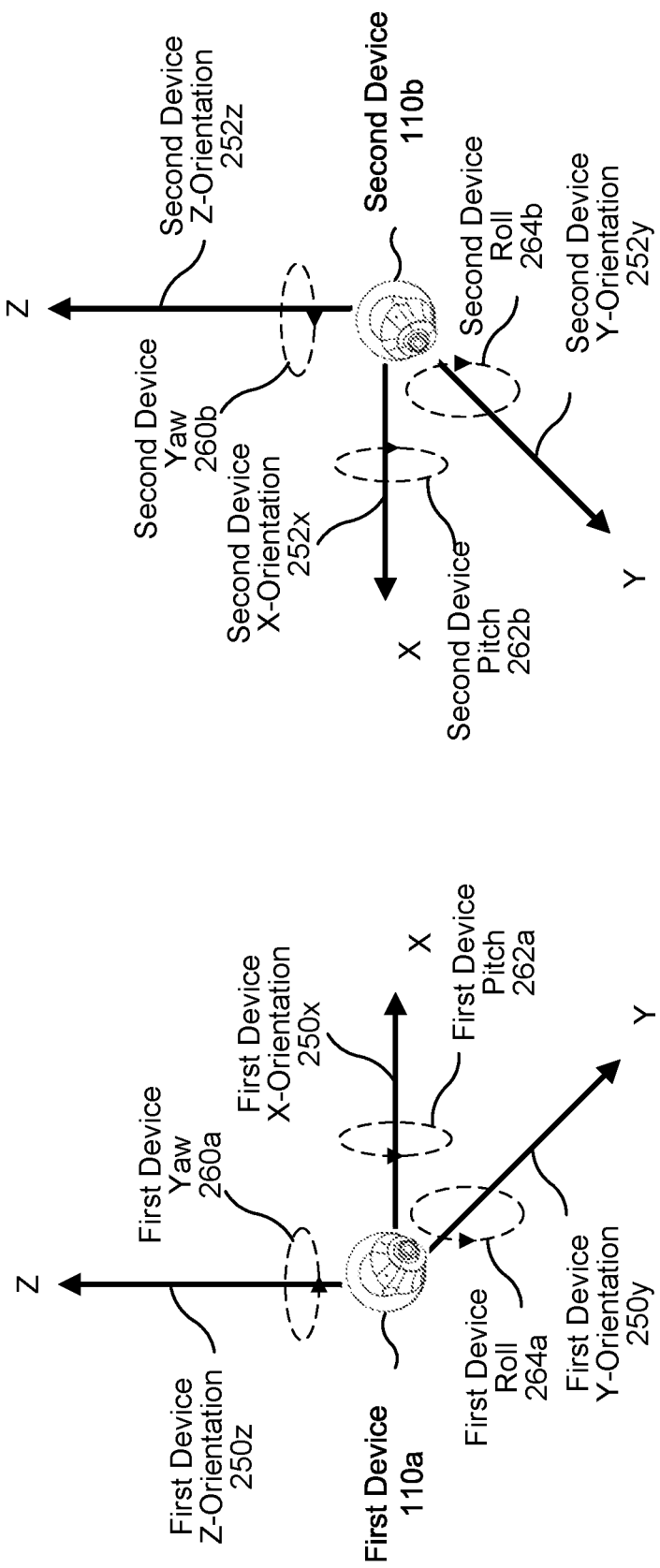

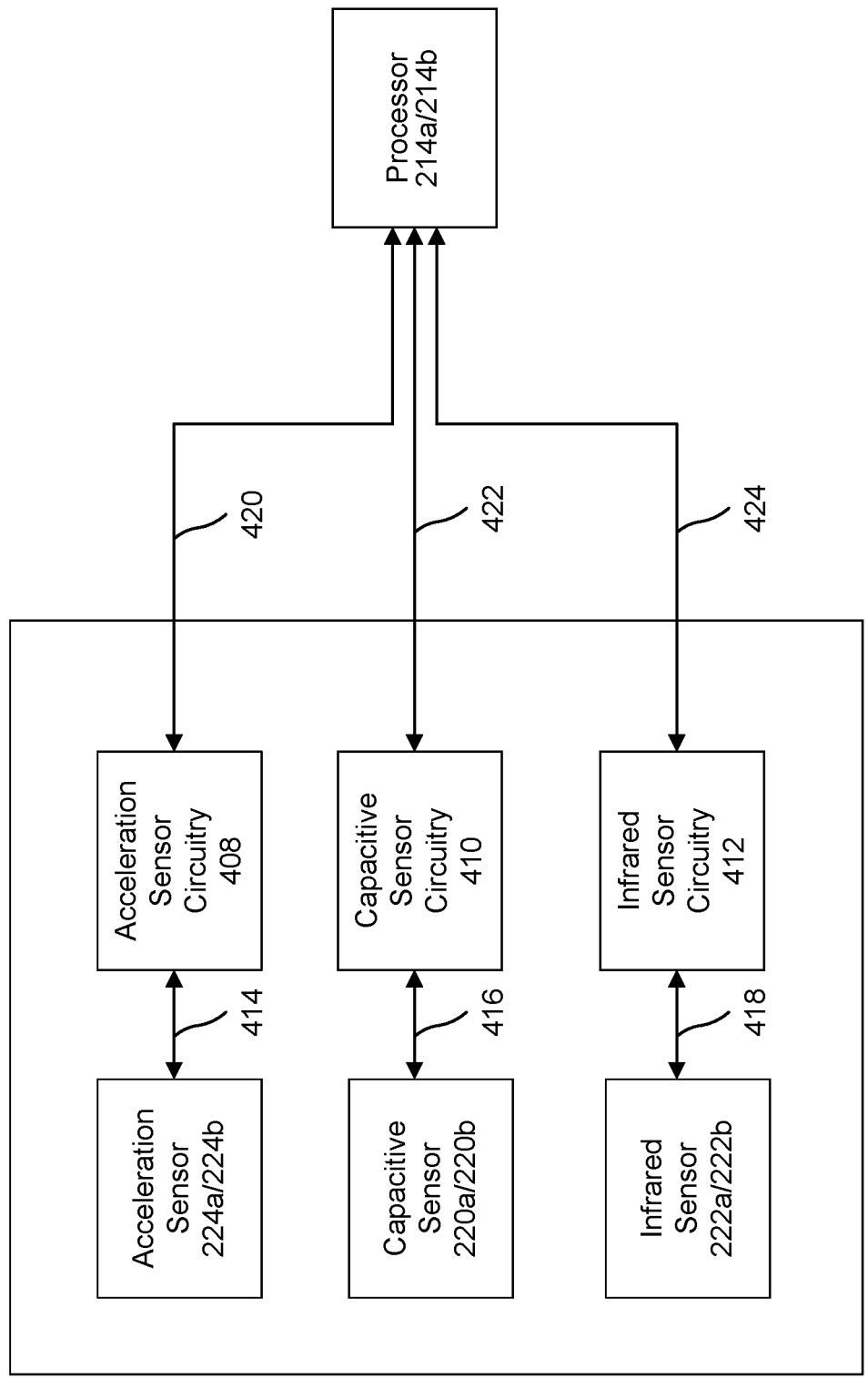

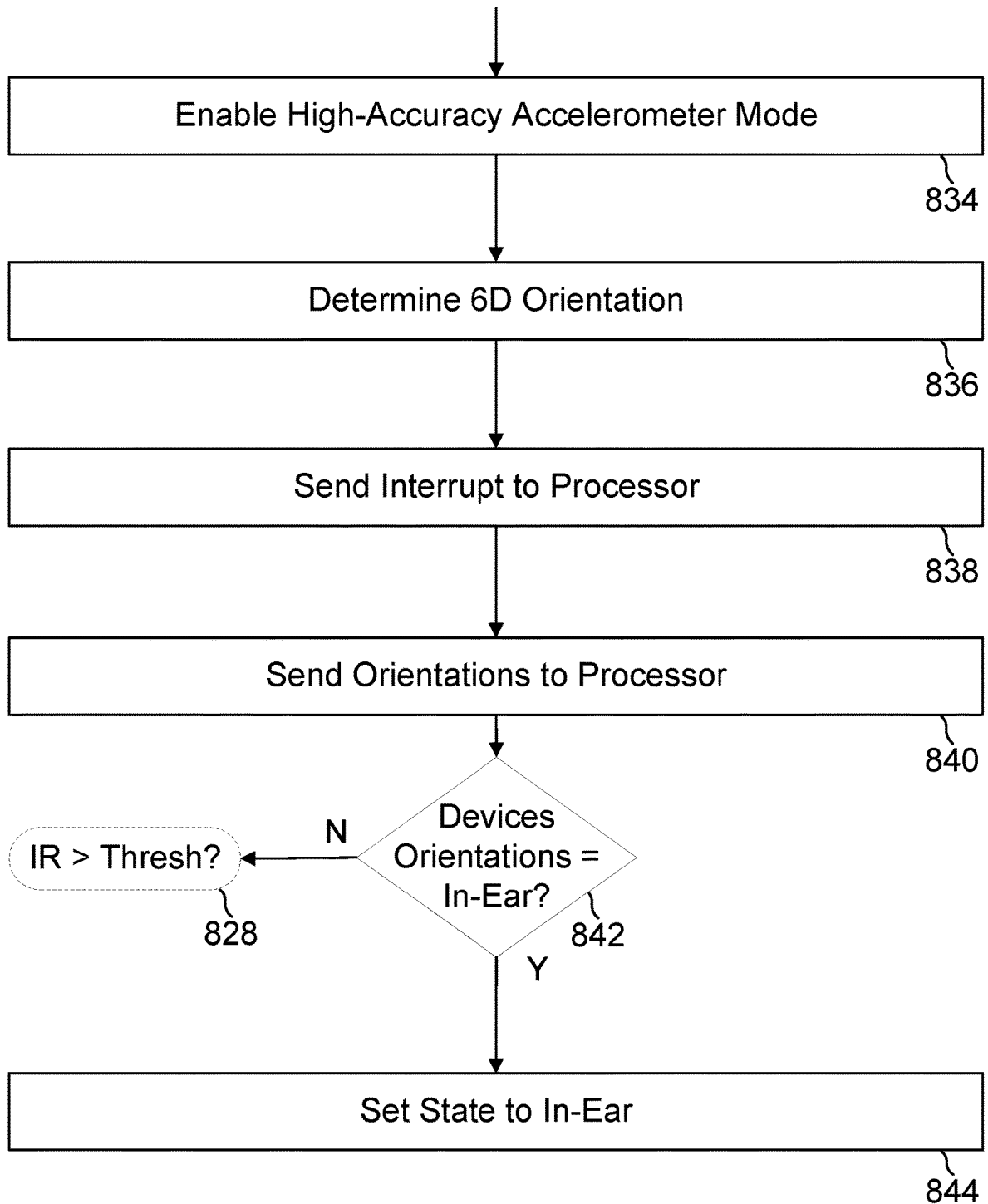

IN-EAR DETECTION OF WEARABLE DEVICES

CROSS REFERENCE TO RELATED APPLICATION

This application claims the benefit of priority of U.S. Provisional Patent Application No. 63/077,785, filed Sep. 14, 2020, and entitled "On-Body Detection of Wearable Devices," in the name of Varn Khanna. The above provisional application is hereby incorporated by reference in its entirety.

BACKGROUND

Wireless audio devices, such as wireless earbuds, may be used to communicate wirelessly with a user device, such as a smartphone, smartwatch, or similar device, and/or with each other. The wireless earbuds may be used to output audio sent from the user device, such as music or speech, and/or to receive and send audio to the user device for processing such as speech recognition.

BRIEF DESCRIPTION OF DRAWINGS

For a more complete understanding of the present disclosure, reference is now made to the following description taken in conjunction with the accompanying drawings.

FIG. 1 illustrates a system configured to determine in-ear status of audio devices according to embodiments of the present disclosure.

FIGS. 2A, 2B, 2C, 2D, 2E, and 2F illustrate audio devices configured to determine in-ear status according to embodiments of the present disclosure.

FIG. 4 illustrates sensor components configured to determine in-ear status of audio devices according to embodiments of the present disclosure.

FIGS. 8A, 8B, 8C, and 8D illustrate methods for determining in-ear status of audio devices according to embodiments of the present disclosure.

DETAILED DESCRIPTION

Figure 2D:
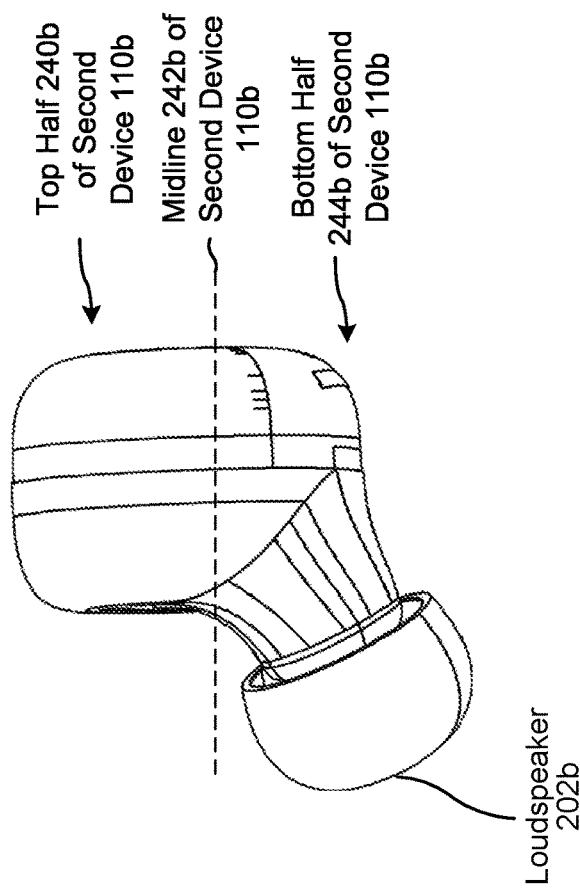

Some electronic user devices may include an audio-based input/output interface. A user may interact with such a user device—which may be, for example, a smartphone, smart speaker, tablet, computer, or other speech-controlled device—partially or exclusively using his or her voice and ears. Exemplary interactions include listening to music or other audio, communications such as telephone calls, audio messaging, and video messaging, and/or audio input for search queries, weather forecast requests, navigation requests, or other such interactions. The user device may include one or more microphones for capturing voice input and hardware and/or software for converting the voice input into audio data. The user device may include an audio output device, such as a loudspeaker, for outputting audio such as music or speech or that, in some embodiments, responds to and/or prompts for the voice input.

Use of the above-described user device by its audio-based input/output interface may, however, be sometimes inconvenient, difficult, or impossible. While exercising, working, or driving, for example, the user's hands may be occupied, and the user may not be able to hold the user device in such a fashion as to effectively interact with the user device's audio interface. Other times, the level of ambient noise may be too high for the user device to accurately detect speech from the user and/or too high for the user to understand audio output from the user device. In these situations, the user may prefer to connect audio device(s) such as headphones to the user device and interact with the audio-based input/output interface therewith. As the term is used herein, "headphones" may refer to any hands-free, wearable audio device and includes headsets, earphones, earbuds, or any similar device. For added convenience, the user may choose wireless audio devices, which communicate with the user device—and optionally each other—via one or more wireless connection(s), such as Bluetooth, WI-FI, near-field magnetic induction (NFMI), cellular long-term extension (LTE), or any other type of wireless connection. Wireless earbuds may be more desirable and/or convenient to users because the earbuds do not require a wire or cord connecting them; such a cord may be distracting and/or uncomfortable.

In the present disclosure, for clarity, headphone components that are capable of wireless communication with both a user device and each other are referred to as "wireless earbuds," but the term "earbud" does not limit the present disclosure to any particular type of wired or wireless headphones. The present disclosure may further differentiate between a "right earbud," meaning a headphone component disposed in or near a right ear of a user, and a "left earbud," meaning a headphone component disposed in or near a left ear of a user. A "primary" audio device communicates with both a "secondary" audio device, using a first wireless connection (such as a Bluetooth or NFMI connection); the primary audio device further communicates with a user device (such as a smartphone, smart watch, or similar device) using a second connection (such as a Bluetooth connection). The secondary audio device communicates directly with only with the primary audio device and does not communicate using a dedicated connection directly with the user device; communication therewith may pass through the primary audio device via the first wireless connection. In other embodiments, both the first and second audio devices may communicate with the user device.

The primary and secondary audio devices may include similar hardware and software; in other instances, the secondary audio device contains different hardware/software included in the primary audio device. If the primary and secondary audio devices include similar hardware and software, they may trade the roles of primary and secondary prior to or during operation. In the present disclosure, the primary audio device may be referred to as the "first device," the secondary audio device may be referred to as the "second device," and the user device may be referred to as the "third device." The first, second, and/or third devices may communicate over a network, such as the Internet, with one or more server devices, which may be referred to as "remote device(s)."

Each of the first and second audio devices may also include a loudspeaker; the loudspeaker may include a single audio-output device or a plurality of audio-output devices. As the term is used herein, a loudspeaker refers to any audio-output device; in a system of multiple audio-output devices, however, the system as a whole may be referred to as a loudspeaker while the plurality of audio-output devices therein may each be referred to as a "driver."

When an audio device is disposed in an ear of a user (e.g., the state or status of the audio device is in-ear), it may have different settings or states as compared to when the audio device is not disposed in an ear of the user (e.g., the state or status of the device is out-of-ear). For example, the audio device may turn on and connect to one or more wireless networks when its status is in-ear; when its status is out-of-ear, the audio device may disconnect from one or more wireless networks and/or enter a low-power or "sleep" mode.

The present disclosure offers a system and method for determining when audio devices are disposed in an ear of a user (i.e., the status of the device is in-ear) and when the audio devices are not disposed in an ear of the user (i.e., the status of the device is out-of-ear). As the term is used herein, an audio device is disposed in an ear of a user when both the audio device is proximate a portion of the body of the user (e.g., the ear of the user) and when the audio device has an orientation that corresponds to an in-ear orientation. An audio device may be proximate a portion of the body and not correspond to the in-ear orientation—e.g., the audio device may be proximate the ear but have an orientation corresponding to being upside-down or rotated on a vertical axis. Likewise, the audio device may correspond to an in-ear orientation but not be proximate the portion of the body—e.g., the audio device may be oriented as if it were positioned in an ear but be disposed on a desk or table.

FIG. 1 illustrates a system for determining an in-ear status of a first device 110a (e.g., a first audio device, such as a first earbud) and/or a second device 110b (e.g., a second audio device, such as a second earbud). The first device 110a, which may be a primary wireless earbud, communicates with the second device 110b, which may be a secondary wireless earbud, using a first wireless connection 114a. The first device 110a may also communicate with a third device 112, which may be a user device, using a second wireless connection 114b. The third device 112 may communicate with one or more remote devices 120 over a network 199, which may be or include the Internet. The first device 110a may output first device audio 15a, and the second device 110b may output second device audio 15b; one or both of the devices 110a/110b may receive user audio 11 from a user 5.

The first and/or second device 110a/110b may determine (130) that it is proximate a first portion of the user's body. As described in greater detail herein, a motion sensor, such as an accelerometer, may first be used to determine that the first and/or second device 110a/110b is in motion. If the acceleration of the first and/or second device 110a/110b in any of the x, y, or z directions is greater than an acceleration threshold, a capacitive touch sensor is turned on and measures an amount of capacitance between itself and a grounded body (i.e., the user's body) in contact with it. If an amount of sensed capacitance is greater than a threshold capacitance, an infrared proximity sensor disposed on the device (in, e.g., an inter-lobe insert of an audio device) determines if an object (e.g., a part of the inner ear of the user) is nearby (e.g., within 7.5-15 mm). If an amount of sensed infrared is greater than a threshold amount, the first and/or second device 110a/110b determines that it is proximate a portion of the body of the user.

One of the first and/or second device 110a/110b may send, to the other of first and/or second device 110a/110b, an indication that the first and/or second device 110a/110b is proximate a second portion of the user's body using a similar procedure as described above. In various embodiments, the second device 110b sends this notification to the primary earbud 110a, which receives (132) it. The indication may be data having a first type (e.g., a binary 1) to indicate that the second device 110b is proximate the second portion of the user's body and may have a second type (e.g., a binary 0) to indicate otherwise.

The first device 110a may determine (134) first data corresponding to a first orientation of the first device 110a. The orientation may include six degrees of orientation, which may include three spatial degrees and/or three rotational degrees, such as spatial degrees x, y, z and rotational degrees pitch, yaw, and roll. The orientation sensor may include the accelerometer, a gyroscope, an inertial measurement unit (IMU), a magnetometer, and/or other sensor, and the orientation may be determined from a current status of the sensor and/or a history of prior movement or acceleration determined by the sensor. The first data may include the orientation data. In other embodiments, the first device 110a may process the orientation data to determine if the orientation data corresponds to an in-ear orientation; in these embodiments, the first data may instead or in addition include an indication of the correspondence.

The first device 110a may receive (136), from the second device 110b, second data corresponding to a second orientation of the second device 110b. As explained in greater detail herein, (with reference, for example, to FIGS. 2D and 2E) each of the first device 110a and the second device 110b may independently determine that the determined first and second orientations correspond to orientations consistent with upright orientations. That is, the first and second orientations may represent upright orientations of the devices such that a top half of each device is positioned in an environment above a bottom half of the device. If, for example, a device is positioned upside-down, the top half of the device is positioned below the bottom half of the device, and the orientation of the device is not an upright orientation.

Each of the first device 110a and second device 110b may, for example, compare the orientation to a range of orientations associated with an upright orientation and, if the orientation is within the range, determine that the orientation corresponds to the upright orientation. For example, a vertical degree of orientation, a, may be determined to lie within or without a range of values between a less z-position and a greater z-position; if the degree of orientation z is determined to lie within the range of values, the audio device may determine that the orientation corresponds to the upright orientation. In these embodiments, the first data and second data may correspond to yes or no (e.g., a binary 1 or 0) indicating the correspondence or lack of correspondence. The first device 110a may then determine (138) that the first orientation corresponds to a first upright orientation and that the second orientation corresponds to a second upright orientation if both the first data and the second data indicate "yes."

In some embodiments, the first data and the second data represent the first and second orientations of the first and second devices 110a/110b. That is, the first and second data include representations of the orientations of the devices 110a/110b, such as a 6D orientation. In these embodiments, the first device 110a may determine (138) that the first orientation corresponds to a first ear of the user and that the second orientation corresponds to a second ear of the user if both the first data and the second data correspond to an upright orientation (e.g., a top portion of the devices 110a/110b is facing upwards). In further embodiments, as shown below in FIG. 2F, the first device 110a and/or second device 110b may instead or in addition determine if both the first data and the second data correspond to a first loudspeaker of the first device 110a being disposed proximate to a second loudspeaker of the second device 110b (e.g., the first and second loudspeakers of the devices 110a/110b correspond to an in-ear orientation such that each loudspeaker of each device is disposed closest to the other loudspeaker). If so, the first device 110a (and/or second device 110b) may output (140) audio representing the correspondence to the first and second ears. The first and second devices 110a/110b may each correspond to an upright orientation, but the loudspeakers of the devices may not correspond to an in-ear orientation if, for example, the top half of each device is disposed above the bottom half of each device but the loudspeakers of each device are not proximate each other (e.g., one or both devices 110a/110b is rotated away from an in-ear position with respect to a vertical z axis). The loudspeakers of the first and second devices 110a/110b may correspond to the in-ear position but the orientations of each device may not correspond to the upright positions if, for example, the loudspeakers of the devices are proximate each other but one or both orientations are not upright (e.g., the loudspeakers of the devices are facing each other, but both devices 110a/110b are rotated away from an in-ear position with respect to a vertical z axis). The devices 110a/110b may correspond to the in-ear position if both the orientations of the devices correspond to upright orientations and if the loudspeakers of the devices correspond to the in-ear position.

Though the present disclosure recites determining the in-ear and out-of-ear status of wireless earbuds, one of skill in the art will understand that the systems and methods described herein may be used with other wearable devices, such as smart watches (i.e., determining the on-wrist or off-wrist status of a smart watch) and smart glasses (i.e., determining the on-face or off-face status of a pair of smart glasses). As one of skill in the art will understand, a smart watch is a device wearable on a wrist of a user that may include a display, processor, memory, microphone, loudspeaker, and/or sensors, and a pair of smart glasses is a device wearable on a face of a user, in a fashion similar to eyeglasses, that may include a display or projector, processor, memory, microphone, loudspeaker, and/or sensors. The present disclosure is thus not limited to only wireless earbuds, smart watches, or smart glasses.

FIGS. 2A and 2B illustrate additional features of an embodiment of the first device 110a and second device 110b, respectively. As shown, the first device 110a and second device 110b have similar features; in other embodiments, as noted above, the second device 110b (e.g., the secondary device) may have only a subset of the features of the first device 110a (e.g., the primary device). As illustrated, the first device 110a and second device 110b are depicted as wireless earbuds having an inner-lobe insert; as mentioned above, however, the present disclosure is not limited to only wireless earbuds, and any wearable audio input/output system, such as a wired or wireless headset, over-the-ear headphones, smart glasses, or other such systems, is within the scope of the present disclosure.

The devices 110a/110b may each include a loudspeaker 202a/202b. The loudspeaker 202a/202b may be any type of loudspeaker, such as an electrodynamic loudspeaker, electrostatic loudspeaker, dynamic loudspeaker, diaphragm loudspeaker, or piezoelectric loudspeaker. The loudspeaker 202a/202b may further include one or more drivers, such as balanced-armature drivers or dynamic drivers. The present disclosure is not, however, limited to any particular type of loudspeaker 202a/202b or driver.

The devices 110a/110b may further each include one or more microphones, such as first microphones 204a/204b and/or second microphones 205a/205b. The microphones 204a/204b and 205a/205b may be any type of microphone, such as a piezoelectric or MEMS microphone. The loudspeakers 202a/202b and microphones 204a/204b and 205a/205b may be mounted on, disposed on, or otherwise connected to the devices 110a/110b. The devices 110a/110b may each further include inner-lobe inserts that may bring the loudspeakers 202a/202b and/or one or both of the microphones 204a/204b and 205a/205b closer to the eardrum of the user and/or block some or all ambient noise.

Each device 110a/110b may include one or more batteries 206a/206b for providing power to the devices 110a/110b; the batteries 206a/206b may be single-use or rechargeable batteries. One or more antennas 210a/210b may be used to transmit and/or receive wireless signals over the first connection 114a and/or second connection 114b; the devices 110a/110b may include an I/O interface that contains software and hardware to control the antennas 210a/210b and transmit signals to and from other components. A processor 214a/214b may be used to execute instructions in a memory 216a/216b; the memory 216a/216b may include volatile memory (e.g., random-access memory) and/or non-volatile memory or storage (e.g., flash memory).

The devices 110a/110b may further each include one or more sensors. The sensors may include one or more accelerometers 224a/224b, capacitive-based contact sensors 220a/220b, and infrared (IR)-based proximity sensors 222a/222b. Some sensors, such as accelerometers 224a/224b, may consume comparatively little power and may be powered on and sensing data continuously or for long periods of time. Other types of sensors, such as contact sensors 220a/220b and proximity sensors 222a/222b, may consume comparatively more power and may be powered on and sensing data only when needed. The sensors may further include gyroscopes, skin temperature sensors, heart rate monitors, humidity sensors, pressure sensors, and bone-conduction sensors.

FIG. 2C illustrates orientations of the first device 110a and of the second device 110b. The first device 110a may have a first orientation corresponding to an x-orientation 250x, a y-orientation 250y, and a z-orientation 250z; the second device 110b may have a second orientation corresponding to a x-orientation 252x, a y-orientation 252y, and a z-orientation 252z. The first device 110a may instead or in addition have a first yaw 260a, a first pitch 262a, and a first roll 264a; the second device 110b may have a second yaw 260b, a second pitch 262b, and a second roll 264b. As described herein, any system or method for describing orientation, such as 6D orientation, is within the scope of the present disclosure. The 6D orientation may include the x-orientation, the y-orientation, the z-orientation, pitch, yaw, and roll.

Figure 2E:
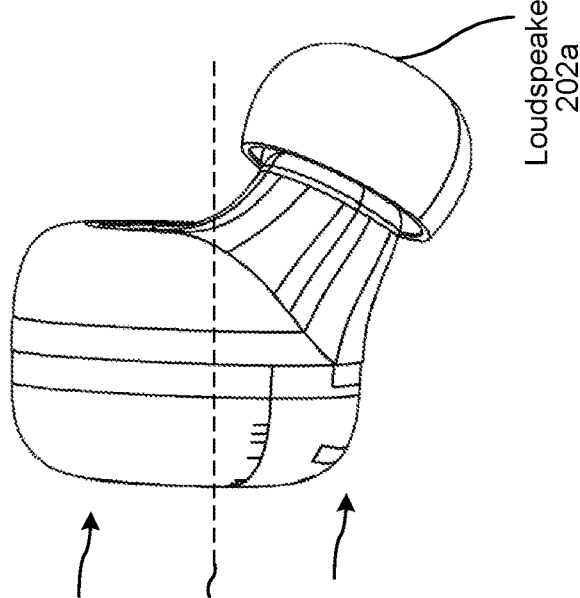

FIGS. 2D and 2E illustrate first and second devices 110a/110b disposed in upright orientations, respectively. Referring to FIG. 2D, a top half 240a of the first device 110a is disposed above a midline 242a of the first device 110a, and a bottom half 244a of the first device 110a is disposed below the midline 242a of the first device 110a. In other words, the half of the first device 110a that includes the loudspeaker 202a is disposed below the midline 242a, while the half of the first device 110a that lacks the loudspeaker 202a is disposed above the midline 242a. Similarly, a top half 240b of the second device 110b is disposed above a midline 242b of the second device 110b, and a bottom half 244b of the second device 110b is disposed below the midline 242b of the second device 110b. In other words, the half of the second device 110b that includes the loudspeaker 202b is disposed below the midline 242b, while the half of the second device 110b that lacks the loudspeaker 202b is disposed above the midline 242b. If each device 110a/110b is disposed such that the bottom half 224a/224b is not below the midline 242a or such that the top half 240a/240b is not above the midline 110a (e.g., the device 110a/110b is upside down and/or otherwise rotated about the midline), the device 110a/110b does not correspond to the upright position.

Figure 2F:
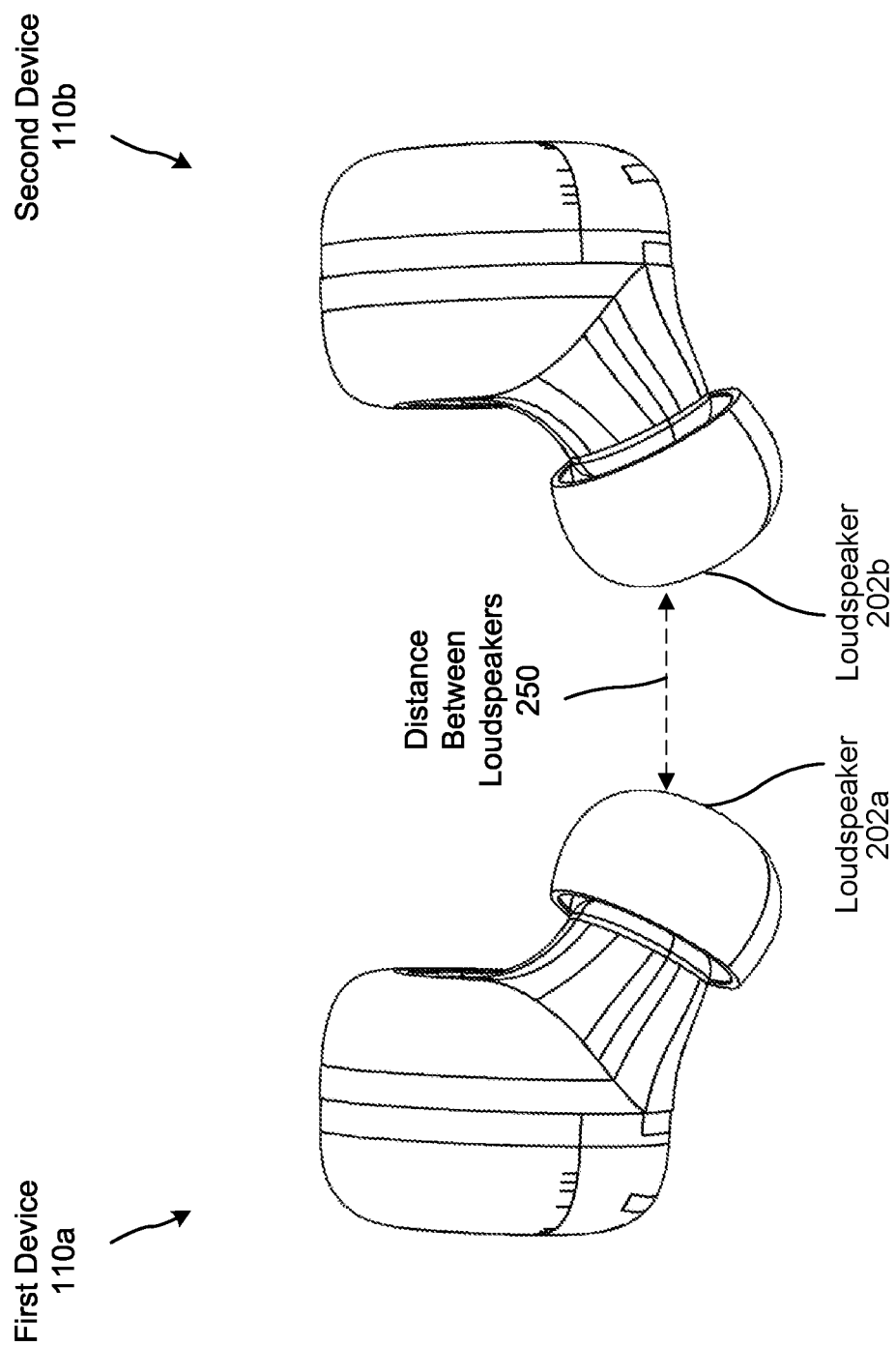

FIG. 2F illustrates first and second devices 110a/110b disposed such that their loudspeakers 202a/202b correspond to the in-ear orientation. Referring also to FIG. 2C, each device 110a/110b may correspond to a similar pitch and roll, but their yaws may differ by approximately 180 degrees. In other words, the devices 110a/110b are oriented such that the loudspeakers 202a/202b "face" each other. The distance 250 between the loudspeakers 202a/202b indicates that the loudspeakers are proximate to each other; this distance 250 may correspond to the width of a head of the user.

Figure 3:
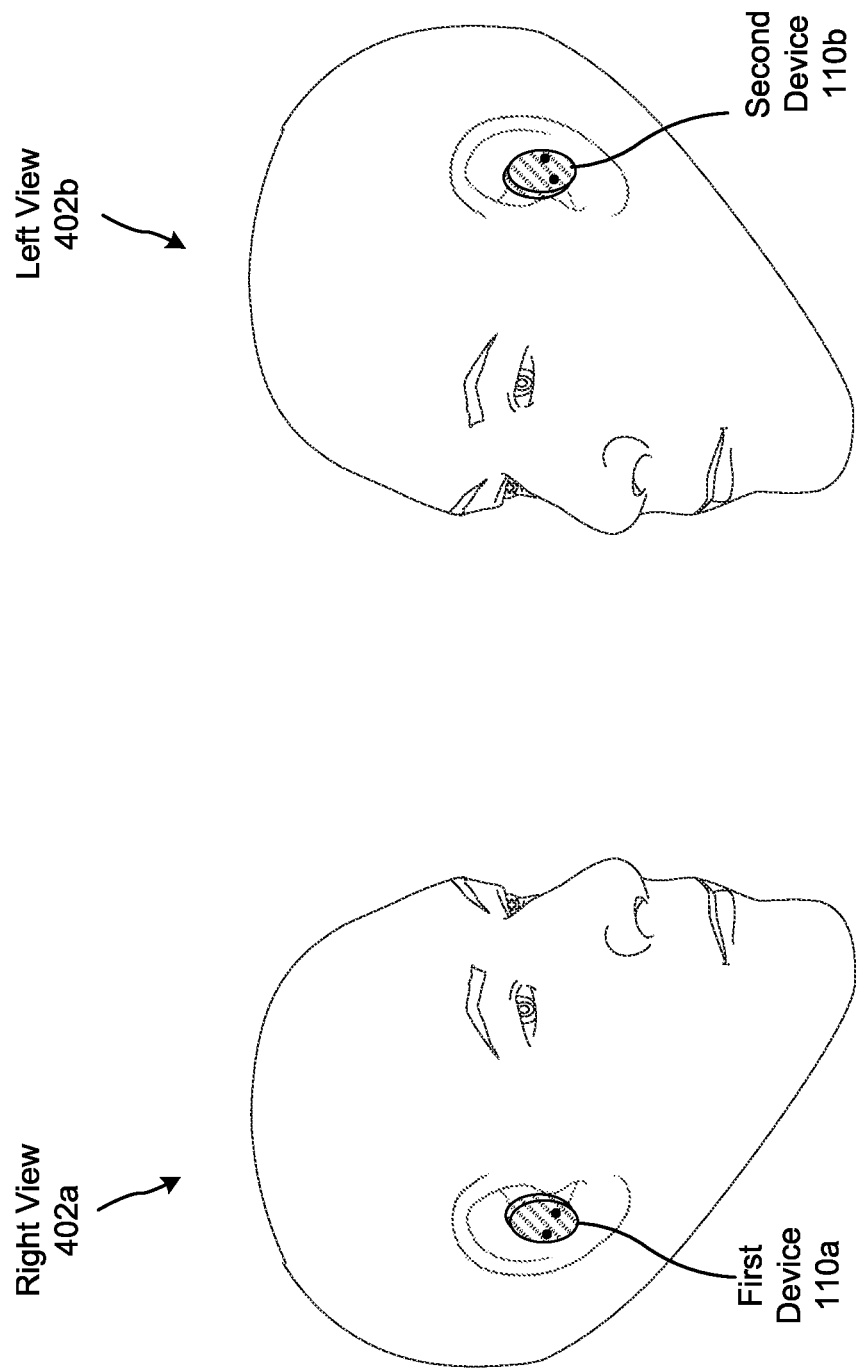
FIG. 3 illustrates audio devices configured to determine in-ear status in use according to embodiments of the present disclosure.

FIG. 3 illustrates a right view 402a and a left view 404b of a user of the first device 110a and the second device 110b; both devices 110a/110b have a state corresponding to an in-ear state such that each device 110a/110b is both proximate an ear of the user 5 and has an orientation corresponding to the ear of the user 5.

FIG. 4 is a diagram of sensor components according to embodiments of the present disclosure. The devices 110a/110b may include an acceleration sensor 224a/224b (also referred to herein as an accelerometer). The acceleration sensor 224a/224b may be, for example, a microelectromechanical system (MEMS) device and may be capable of determining acceleration in one of three (x, y, z) directions. In some embodiments, the acceleration sensor 224a/224b may also be used as an orientation sensor and may also determine three degrees of rotational disposition. In other embodiments, a separate orientation sensor may be used instead of the acceleration sensor 224a/224b.

The devices 110a/110b may also include a capacitive sensor 220a/220b, which may also be referred to herein as a contact sensor or a capacitive contact sensor. The capacitive sensor 220a/220b may sense a capacitance between an electrode and a grounded body, such as a human body, in contact with or near the electrode. A high capacitance indicates contact while a low capacitance indicates lack of contact. A capacitance threshold may be used to distinguish between contact and no contact.

The devices 110a/110b may also include an infrared sensor 222a/222b, which may also be referred to herein as a proximity sensor or infrared proximity sensor. The infrared sensor 222a/222b may emit infrared light and sense how much is reflected back; if an object is proximate the infrared sensor 222a/222b, more light is reflected and sensed than if the object is not proximate. An infrared threshold may be used to distinguish between an object being proximate or not proximate.

The acceleration sensor 224a/224b, capacitive sensor 220a/220b, and infrared sensor 222a/222b may communicate with respective acceleration sensor circuitry 408, capacitive sensor circuitry 410, and infrared sensor circuitry 412 using respective signals 414, 416, 418. The circuitry 408, 410, and 412 may include circuitry for turning each sensor 224a/224b, 220a/220b, 222a/222b on or off, circuitry for receiving data from each sensor 224a/224b, 220a/220b, 222a/222b, circuitry for comparing the received data to one or more thresholds, circuitry for raising an interrupt with the processor 214a/214b if and when a threshold is crossed, and one or more registers for storing data that the processor 214a/214b may request. The circuitry 408, 410, and 412 may communicate with the processor 214a/214b using respective signals 420, 422, 424. The circuitry 408, 410, and 412 may power on the sensors 224a/224b, 220a/220b, 222a/222b even when the processor 214a/214b is in a lower-power or sleep mode.

Figure 5A:
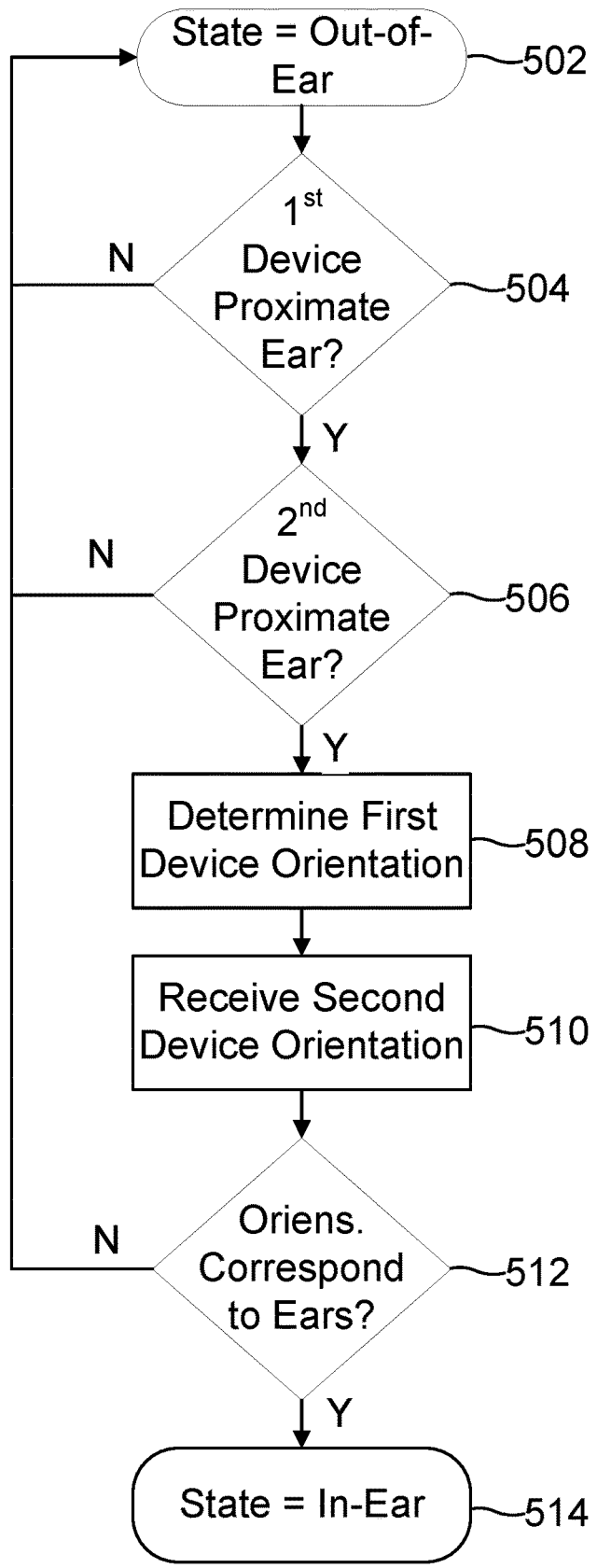
FIGS. 5A, 5B, and 5C illustrate methods for determining in-ear status of audio devices according to embodiments of the present disclosure.
Figure 5B:
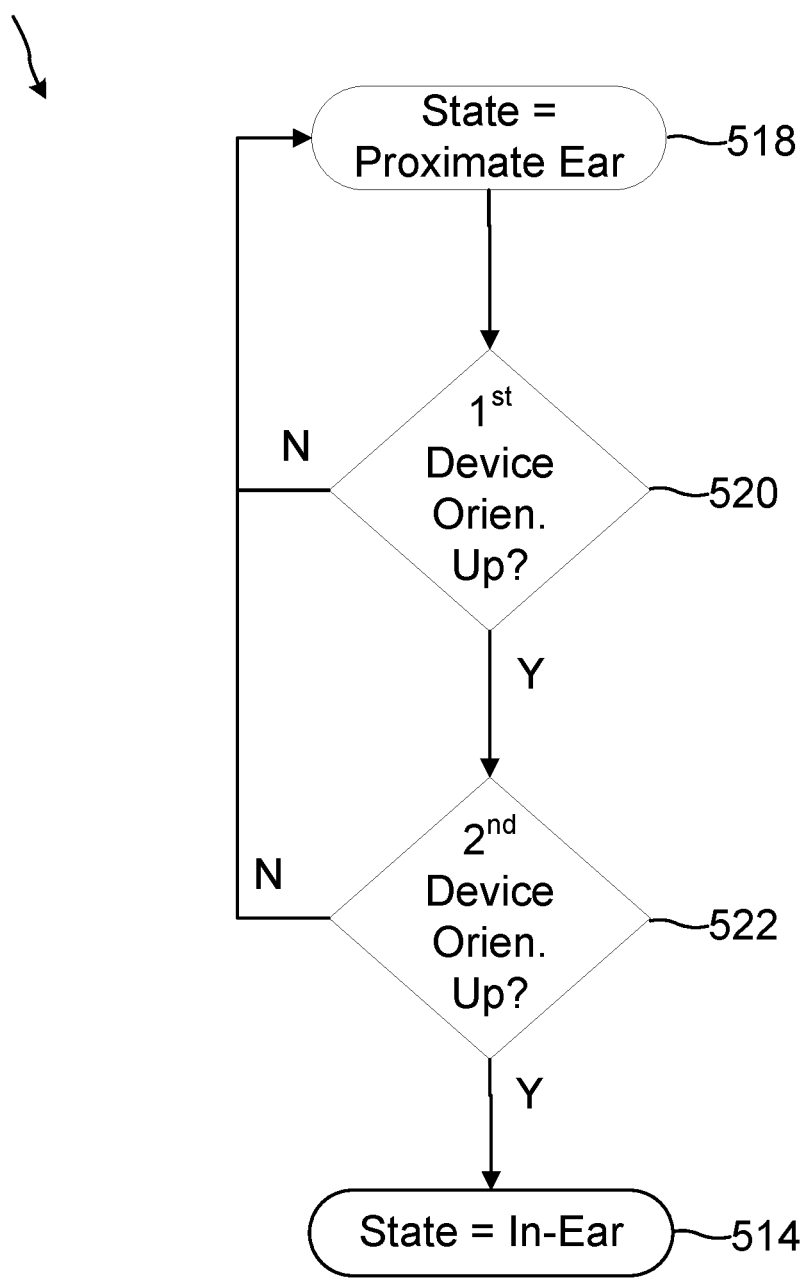
Figure 5C:
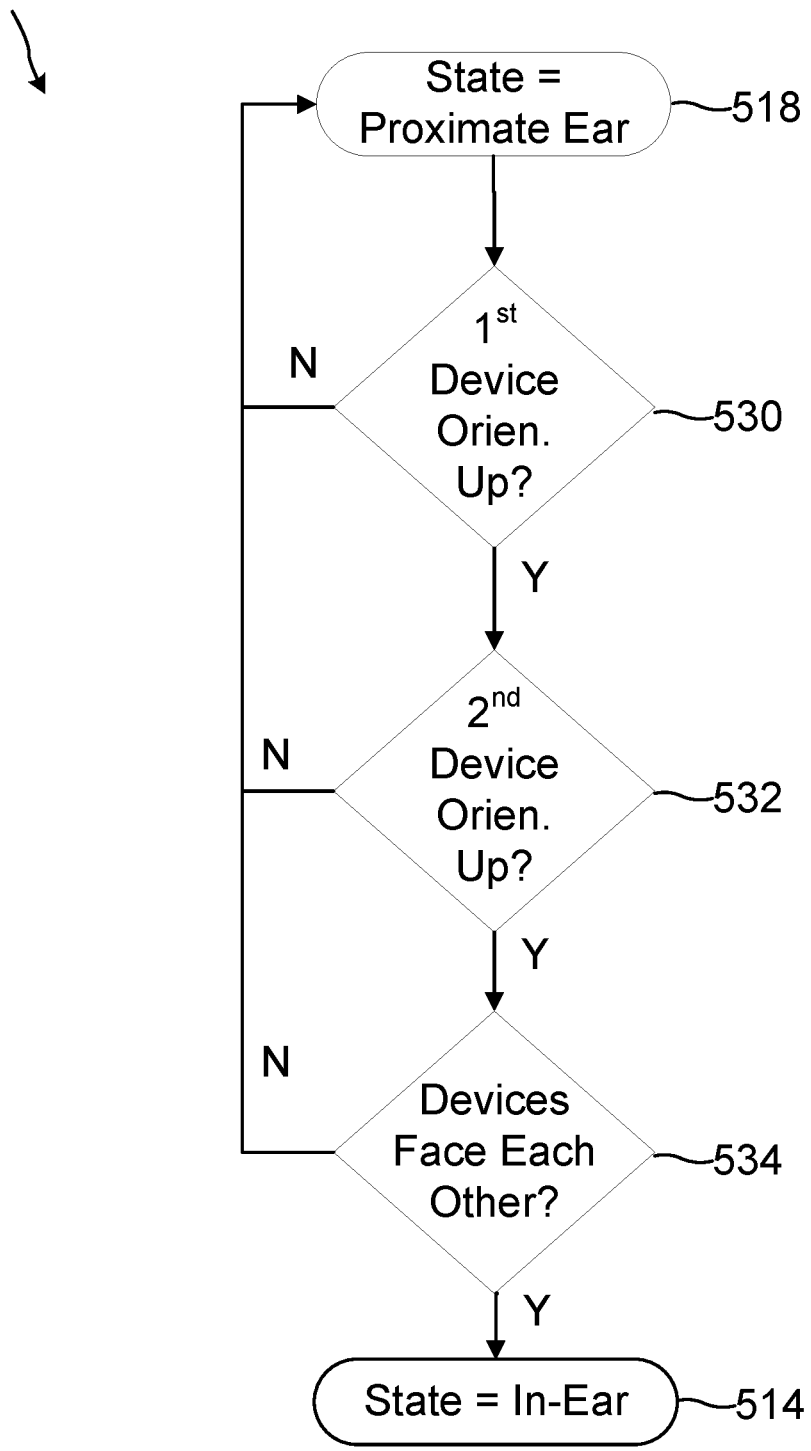

FIGS. 5A, 5B, and 5C illustrate methods for determining in-ear status of audio devices according to embodiments of the present disclosure. Referring first to FIG. 5A, the method begins by assigning an out-of-ear status (502) to first and/or second devices 110a/110b upon, for example, device start, re-start, or wake from sleep. The first device 110a may determine (504) if it is proximate a first portion (e.g., a first ear) of a body of a user. If not, the method returns to the out-of-ear status. The first device 110a may make this determination using one or more sensors, as shown in, for example, FIG. 6. The second device 110b may similarly determine (506) whether it is proximate a second portion (e.g., a second ear) of the body of the user; the second device 110b may send an indication of this determination to the first device 110a using, for example, the first wireless connection 114a.

The first device 110a may send, to the second device 110a via the first wireless connection 114a, a request to send the determination; in other embodiments, the second device 110b sends the indication upon making the determination. In some embodiments, before the first device 110a sends the request and/or before the second device 110b sends the indication, the first and/or second device 110a/110b waits for a period of time after determining that the sending or receiving device 110a/110b determines that it is proximate the portion of the body. For example, if the first device 110a determines that it is proximate the portion of the body, it way wait for the period of time before sending the request to the second device 110b. This period of time may correspond to a period of time that the user 5 may take to insert a first earbud into a first ear and insert the second earbud in a second ear. The period of time may be, for example, 2-4 seconds; in some embodiments, the period of time is 3 seconds.

If the second device 110b is not proximate the second portion of the body of the user, the method returns to the out-of-ear state. If it is proximate (and sends the corresponding indication to the first device 110a), the first device 110a may determine (508) first data corresponding to a first orientation of the first device 110a. As mentioned above, the first data may include information related to the spatial position of the device 110a in an environment, such as its x, y, z coordinates with respect to an origin point in the environment and/or information related to its rotational position in the environment, such as data representing its pitch, yaw, and roll. The second device 110b may similarly determine second data corresponding to its orientation.

As mentioned above, each of the first device 110a and/or second device 110b may determine the first and/or second data using an orientation sensor. The orientation sensor may be one of the sensors mentioned above (e.g., the accelerometer 224*a*/224*b*) and/or a separate sensor. The acceleration sensor 224*a*/224*b* may operate in three modes; a low-power or sleep mode, an acceleration-sensing mode, and an orientation-sensing mode. In the acceleration-sensing mode, the acceleration sensor 224*a*/224*b* may determine (x, y, z) acceleration data; in the orientation-sensing mode, the acceleration sensor 224*a*/224*b* may further determine three-dimensional orientation data. The acceleration sensor 224*a*/224*b* may send the orientation data to the acceleration sensor circuitry 408, which may in turn send the orientation data to the processor 214*a*/214*b*.

The processor 214*a*/214*b* may compare the orientation data to a range of orientations corresponding to the ear of the user; the range may correspond to orientations associated with the device 110*a*/110*b* being disposed in the ear. The range of orientations may include a range of head movements of the user, such as the head tiling forward or backward and/or side-to-side. For example, if a default rotation of the devices 110*a*/110*b* when the user's head is in a neutral, erect position is defined as approximately 0°, the range of rotations corresponding to the devices 110*a*/110*b* being disposed in the ear may be −5°-5° to account for forward-and-back tilting of the head of the user. Other dimensions of the orientation may have similar ranges of values. In some embodiments, the range of orientations corresponds to other potential positions of the user's head other than that of the neutral position (and potential tilting of the head from the neural position). For example, the range of orientations may include those corresponding to the user lying down (e.g., in a bed or on a couch) and/or leaning back (e.g., in a reclining chair).

The processor 214*b* of the second device 110*b* may similarly determine second data using (a similar orientation sensor) that represents an orientation of the second device 110*a*. The second device 110*b* may determine of this orientation corresponds to the ear and may send an indication thereof to the first device 110*a*. In other embodiments, the second device 110*b* instead or in addition sends data representing the orientation to the first device 110*a*. Further details of these embodiments are explained in greater detail below with reference to FIGS. 5B and 5C.

The first device 110*a* may thus receive (510) the second data corresponding to the orientation of the second device 110*a* and may determine (512) if the first orientation of the first device 110*a* corresponds to a first ear and if the second orientation of the second device 110*b* corresponds to the second ear. Referring to FIG. 5B, the first device 110*a* and/or second device 110*b* may determine (518) that either one or both devices is not proximate an ear. The first device 110*a* may determine (520) if the orientation of the first device 110*a* corresponds to the first ear by comparing the orientation data from the orientation sensor to the range of orientation values corresponding to an ear (e.g., is the first device 110*a* oriented "up" with respect to the environment); the first data may thus include a representation of this correspondence (e.g., "1" for correspondence and "0" for lack of correspondence). This determination that the orientation of the first device 110*a* corresponds to the first ear may take into account whether the first device 110*a* is configured to correspond to a left or right ear; a device configured to correspond to a left ear may, for example, correspond to a different set of in-ear orientations than a device configured to correspond to a right ear. The second device 110*b* may similarly determine (522) if the orientation of the second device 110*b* corresponds to an ear by comparing the orientation data from the orientation sensor to the range of orientation values corresponding to the ear; the second data may similarly include a representation of this correspondence (e.g., "1" for correspondence and "0" for lack of correspondence). The determination that the orientation of the second device 110*a* corresponds to the second ear may similarly take into account whether the second device 110*a* is configured to correspond to a left or right ear. The second device 110*b* may send the second data representing the determination to the first device 110*a*. The first device 110*a* may then determine that both the orientation of the first device 110*a* corresponds to an in-ear orientation and that the orientation of the second device 110*b* corresponds to an in-ear orientation. If so, the first device 110*a* may determine (514) that both the first device 110*a* and the second device 110*b* correspond to in-ear states.

Referring to FIG. 5C, in some embodiments (and as described above), the second device 110*b* may send second data that includes a representation of the orientation of the second device 110*b* instead of or in addition to the indication that the orientation of the second device 110*a* corresponds to an ear. The first device 110*a* may thus determine a first orientation of the first device 110*a* and receive a second orientation of the second device 110*b* and, using these orientations, determine that the state of the devices corresponds to an in-ear state.

In these embodiments, the first device 110*a* may make (530) a first determination regarding the orientation of the first device 110*a* using only the first orientation data of the first device 110*a*. This determination may correspond to the first device 110*a* having an upright orientation; e.g., the first microphone 204*a* is disposed at a position above the first loudspeaker 202*a* relative to the environment. The first device 110*a* may similarly make (532) a second determination regarding the orientation of the second device 110*b* using only the second orientation data of the second device 110*b*. This determination may correspond to the second device 110*b* similarly having an upright orientation; e.g., the first microphone 204*b* is disposed at a position above the first loudspeaker 202*b* relative to the environment. In some embodiments, as described above, the second device 110*b* may make this determination and send an indication thereof to the first device 110*a*.

The first device 110*a* may, however, also determine (534) if the first orientation and the second orientation correspond to orientations consistent with the devices 110*a*/110*b* being disposed in left and right ears of a user, as illustrated in FIG. 3 (e.g., if the devices 110*a*/110*b* face each other). That is, in addition to determining that each of the first device 110*a* and second device 110*b* have orientations corresponding to a first ear and a second ear, respectively, (as discussed above with reference to FIG. 5B) the first device 110*a* may determine if the first device 110*a* and the second device 110*b* have orientations consistent with being disposed in left and right ears. For example, the user 5 may position the devices 110*a*/110*b* such that each are proximate an ear of the user and such that each orientation corresponds to an ear (but not necessarily the ear of the user) but such that one or both of the devices 110*a*/110*b* is rotated about a vertical axis (e.g., the Z-axis of FIG. 2C). In other words, the user 5 may have positioned a device 110*a*/110*b* backwards or sideways in the ear; the device 110*a*/110*b* may still determine that its orientation corresponds an upright orientation.

The first device 110*a* may thus process the first orientation and the second orientation to determine if a first rotational position of the first device 110*a* with respect to a horizontal plane (e.g., the XY plane of FIG. 2C) is approximately 180° different from a second rotational position of the second device 110*a* with respect to the horizontal plane. In other words, when the devices 110a/110b are in-ear, a first side of the first device 110a (such as the side corresponding to the loudspeaker 202a) is disposed closest to the second device 110b and when a second side of the second device 110b (such as the side corresponding to the loudspeaker 202b) is disposed closest to the first device 110a.

In some embodiments, the determination (534) that the devices 110a/110b face each other may take into account other orientations of the devices 110a/110b. In some embodiments, for example, a first user 5a may wear the first device 110a and a second user 5b may wear the second device 110b. In these embodiments, the first device 110a and/or second device 110b may determine a distance between the first and second devices 110a/110b using, for example, a time-of-flight delay of sending wireless data between the first and second devices 110a/110b. If this distance corresponds to an expected distance between the first user 5a and the second user 5b (for example, 0.5-2.0 meters), the first device 110a may determine that the devices 110a/110b correspond to the in-ear state even if it determines that the devices 110a/110b do not face each other, as described above.

Referring also to FIG. 5A, in some embodiments, when the first device 110a and/or second device 110b determines that the devices correspond to the in-ear state 514, the first device 110a and/or second device 110b may cause output of audio representing that the orientations of the first device 110a and second device 110b correspond to the first and second ears. The audio may be a sound such as a tone or speech indicating the correspondence. For example, the speech may be "Audio devices successfully in-ear." In some embodiments, the first device 110a and/or second device 110b determines the in-ear status for a first time (for, e.g., newly acquired devices 110a/110b) and causes output of first audio, such as the speech. When the first device 110a and/or second device 110b determines the in-ear status for subsequent times, the first device 110a and/or second device 110b cause output of second audio, such as the sound.

Figure 6:
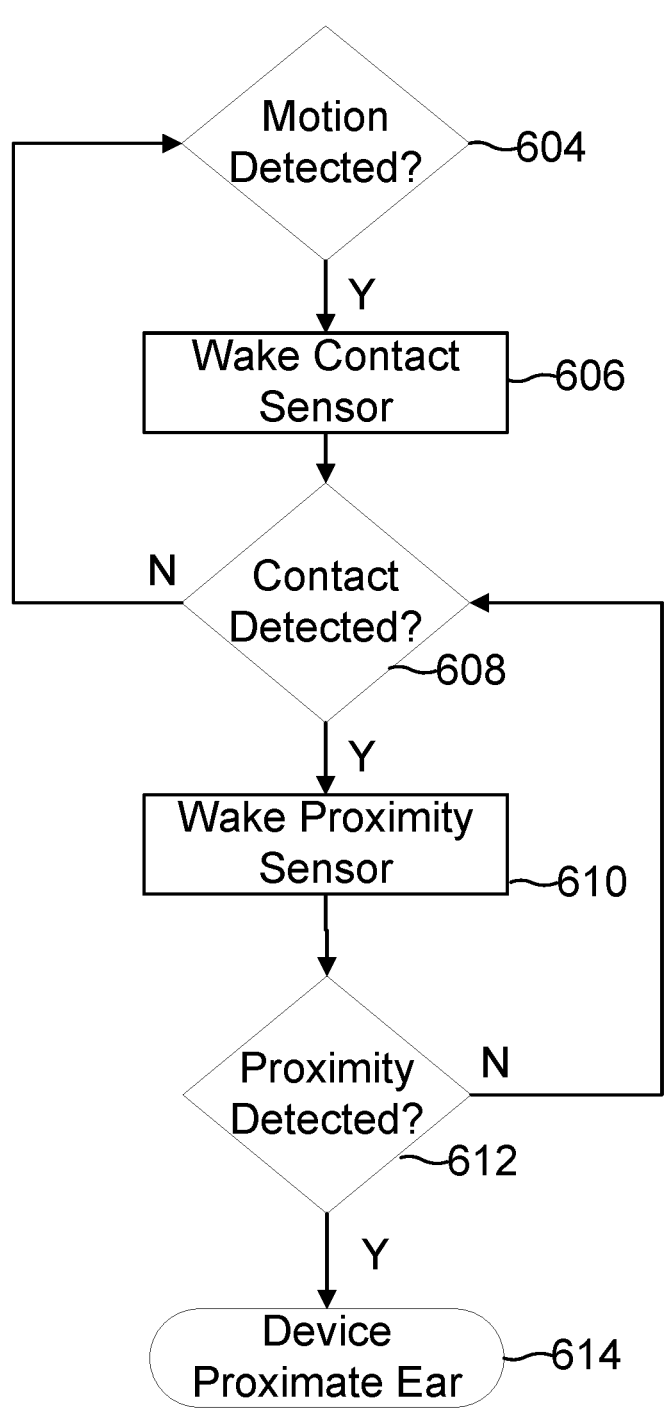
FIGS. 6, 7A, and 7B illustrate methods for determining proximate status of audio devices according to embodiments of the present disclosure.
Figure 8A:
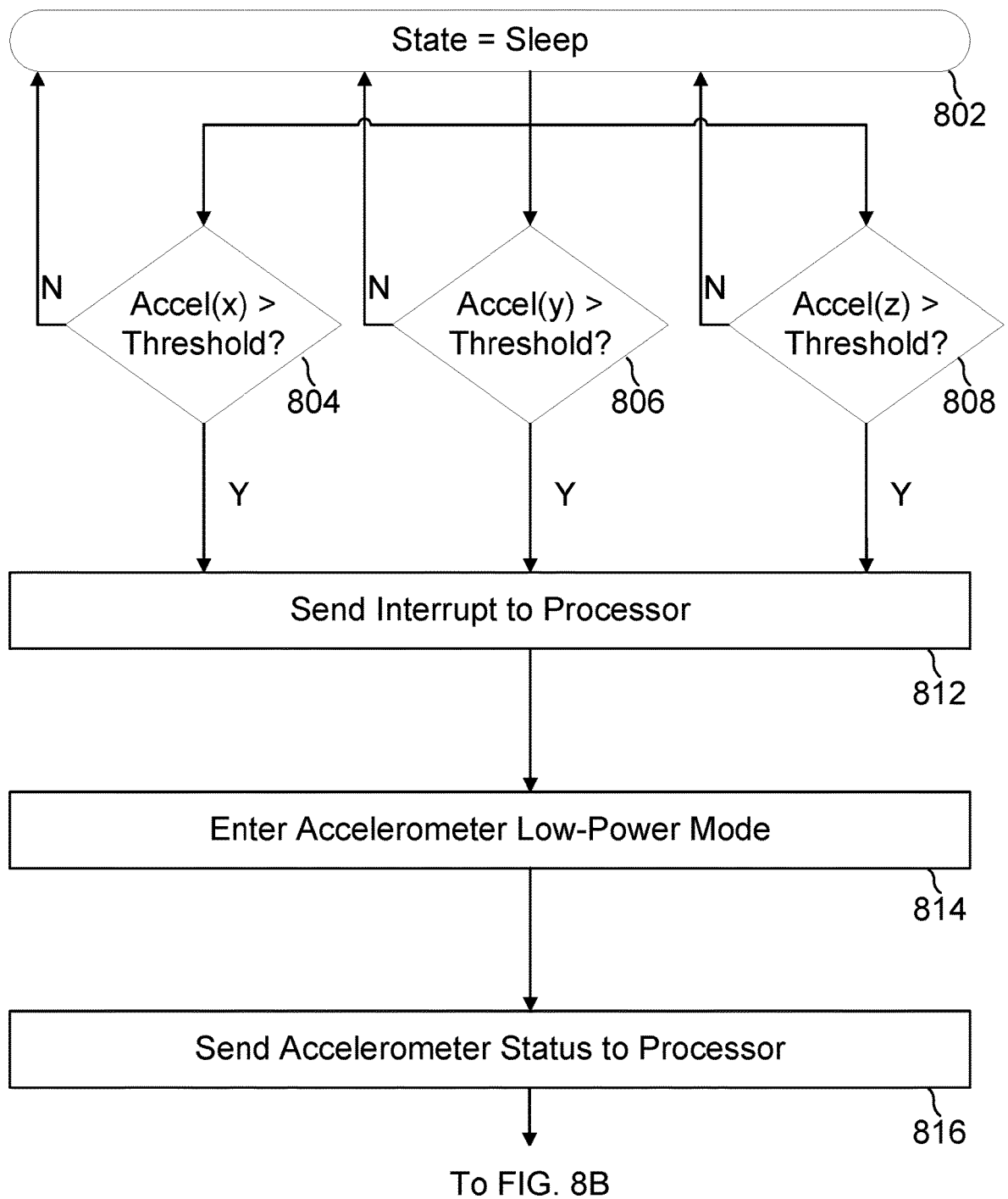
Figure 8B:
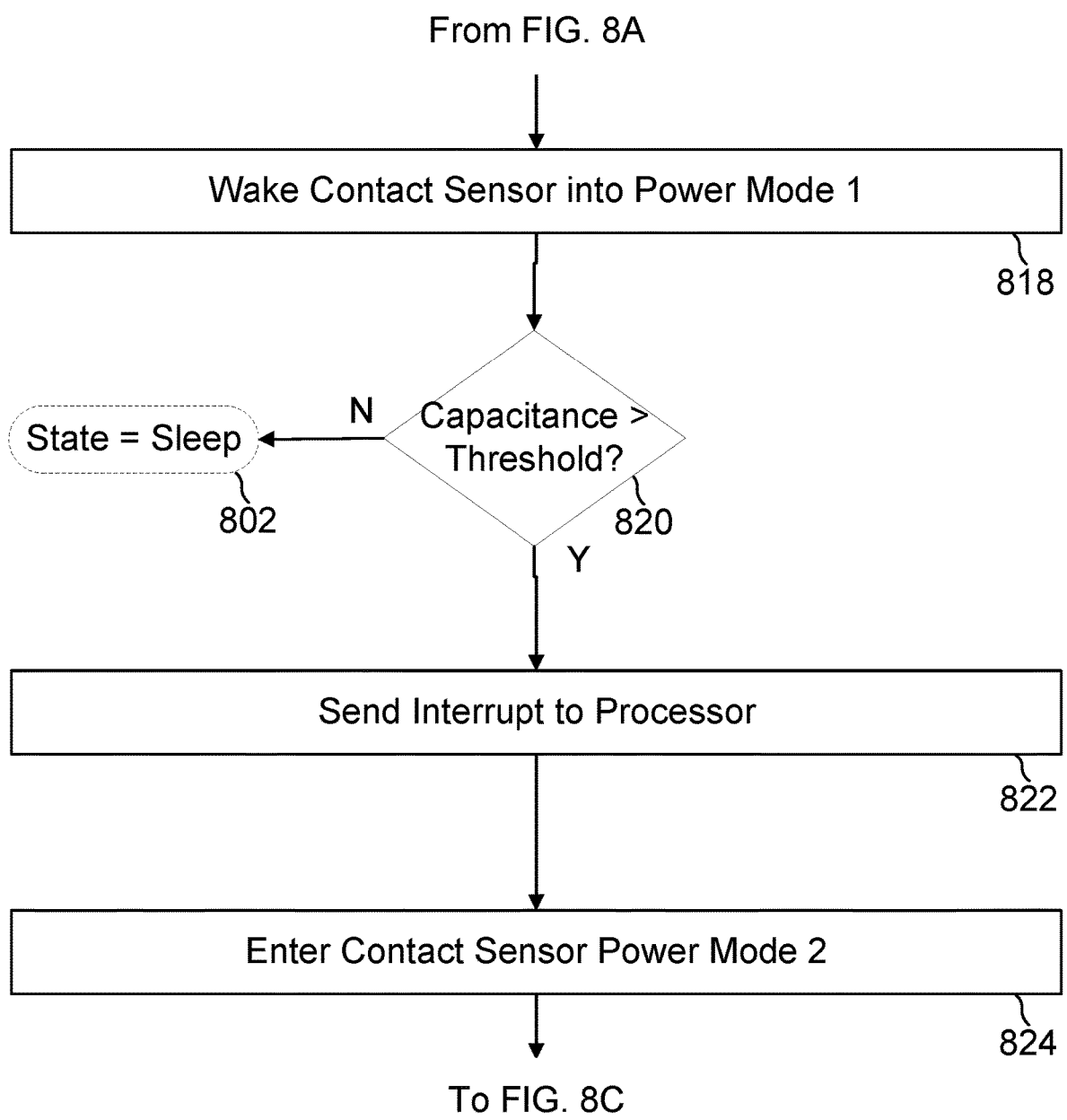
Figure 8C:
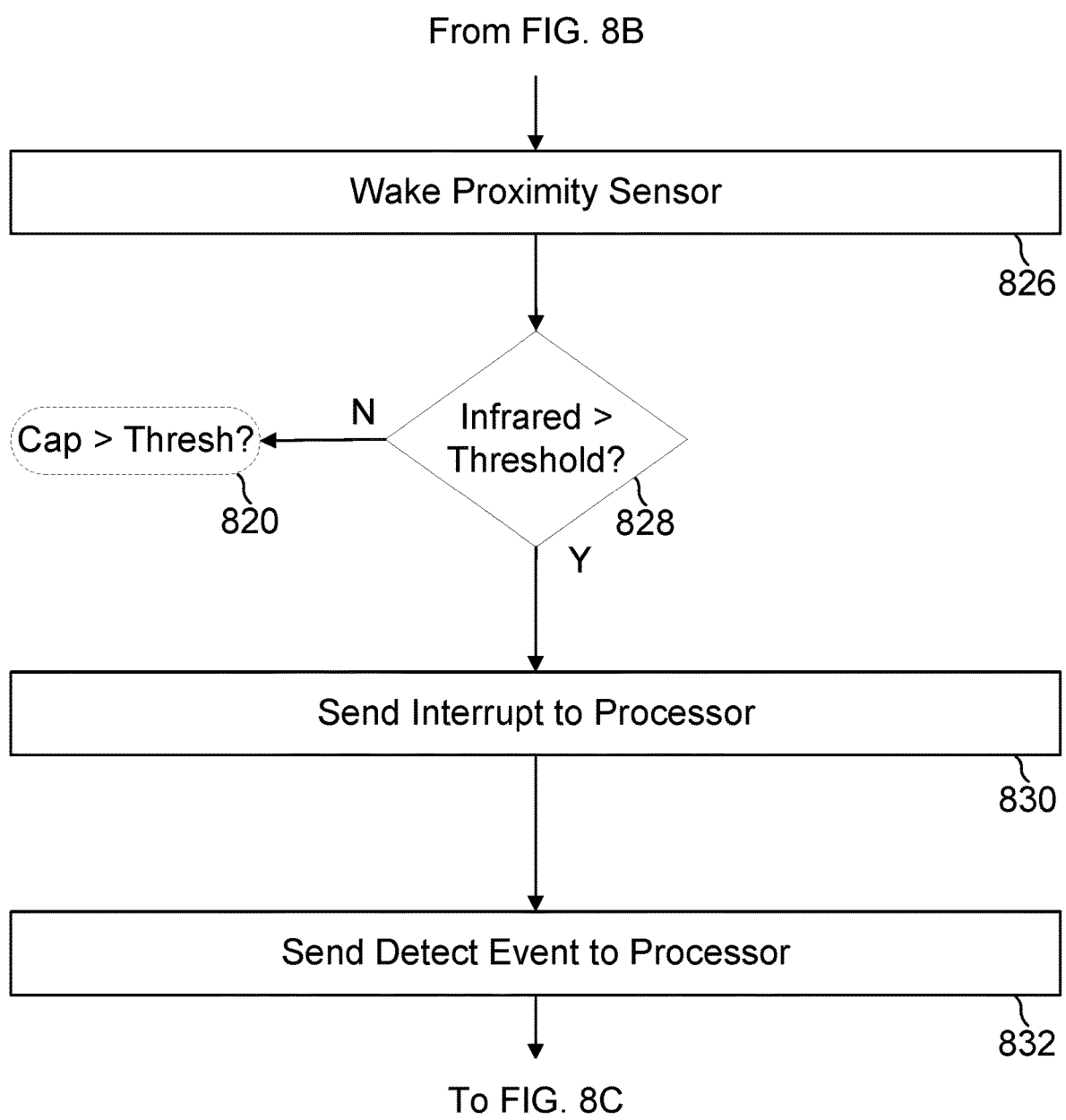

FIG. 6 illustrates a method of determining proximate status of audio devices according to embodiments of the present disclosure. The acceleration sensor circuitry 408 may activate the acceleration sensor 224a/224b continuously or at period intervals. The output of the acceleration sensor 224a/224b is monitored by the acceleration sensor circuitry 408; the acceleration sensor circuitry 408 receives (x, y, z) acceleration data from the acceleration sensor 224a/224b and compares the (x, y, z) acceleration data to one or more thresholds. A single threshold may be used for each (x, y, z) direction or each (x, y, z) direction may have its one threshold (as shown in, for example, FIG. 8A). If a threshold is reached, motion is detected (604).

Once motion is detected, the processor 214a/241b sends (606) a command to the capacitive sensor circuitry 410 to turn on the capacitive sensor 220a/220b. The capacitive sensor 220a/220b, as mentioned above, sends data regarding a sensed capacitance to the capacitive sensor circuitry 410; the greater the capacitance, the more contact there is with a grounded body. The capacitive sensor 220a/220b determines that contact is detected (608) when the sensed capacitance is greater than a capacitance threshold.

The processor 214a/214b then sends a command to the infrared sensor circuitry 412 to wake (610) the proximity sensor 220a/220b. The proximity sensor 220a/220b sends proximity data to the infrared sensor circuitry, which compares the proximity data to a proximity threshold. In some embodiments, the proximity threshold corresponds to proximity of 7.5-15 mm. Once proximity is detected (612), the processor 214a/214b determines that the status of the device 110a/110b is proximate a portion of the body (e.g., ear) of the user 614.

Figure 7A:
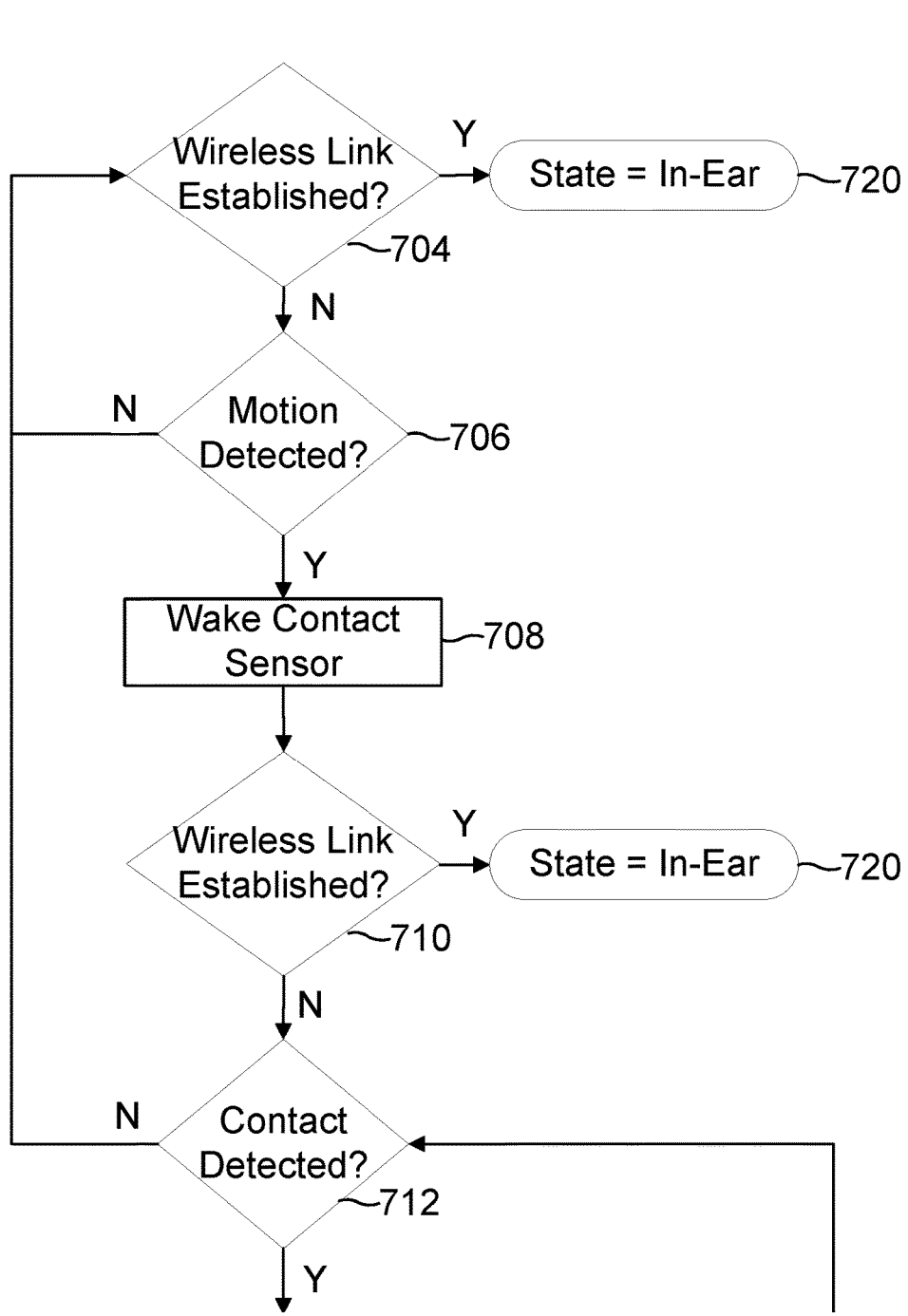
Figure 7B:
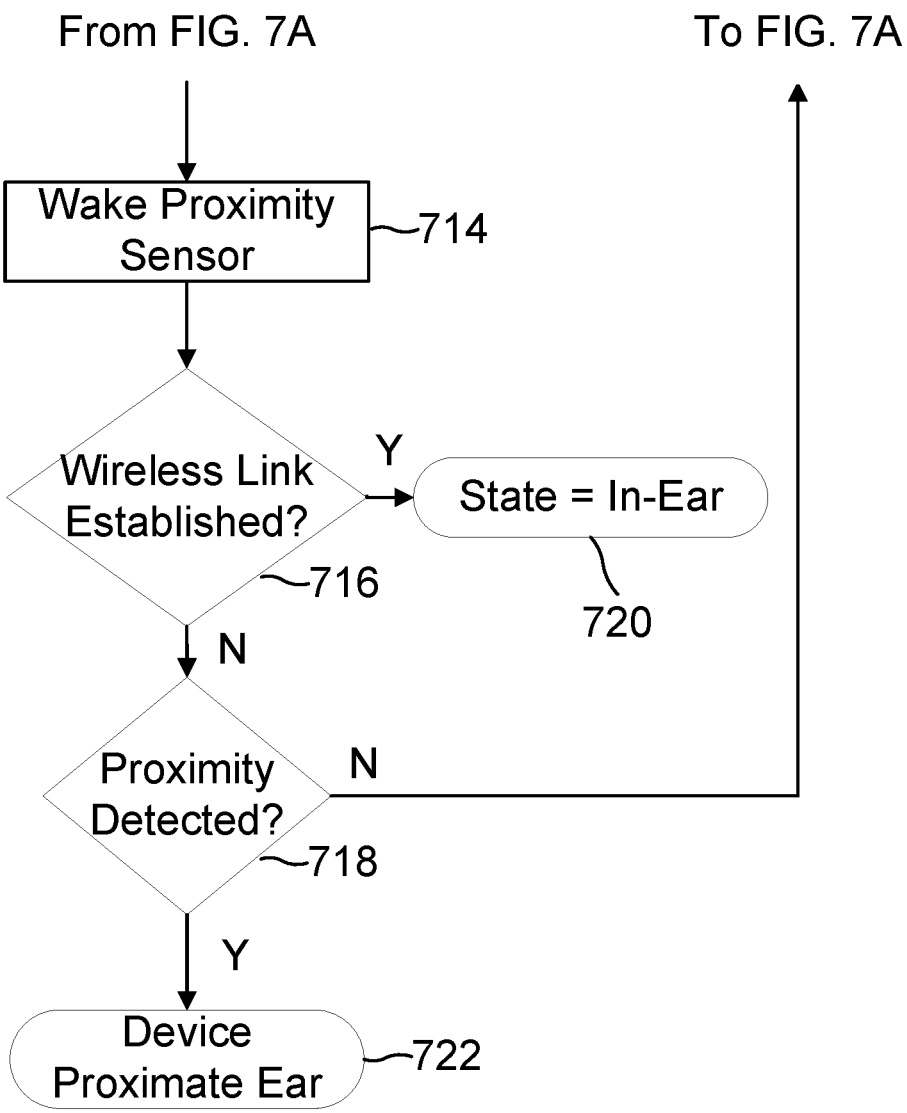

FIGS. 7A and 7B illustrate methods for determining proximate status of an audio device according to embodiments of the present disclosure. The method begins at the out-of-ear status. In these embodiments, the method further includes checking for a wireless (e.g., NFMI and/or Bluetooth) connection between the first device 110a and the second device 110b. Because the wireless connection may be established only when the devices are not in sleep mode and disposed proximate each other, the method may assign the in-ear status to the devices when the wireless link is determined to be established.

Thus, if the wireless link is established (704) after the devices 110a/110b are in the out-of-ear state, the processor 214a assigns (720) the in-ear status to the devices 110a/110b. If the wireless link is not established, as described above, the acceleration sensor 402 collects acceleration data; when the acceleration sensor circuitry 408 determines that motion is detected (706), the processor 214a wakes (708) the contact sensor 404. If the wireless connection is then established (710), the processor 216a assigns the in-ear status (720). If not, the processor 214a determines (712) that contact is detected when the contact sensor 404 senses contact greater than the contact threshold and wakes (714) the proximity sensor 222a/222b. Again, if the wireless connection is established (716) at this point, the processor 214a assigns the in-ear status (720). When proximity is detected (718), the processor 214a assigns the proximate status (722); the processor 214a may then determine the in-ear status in accordance with, for example, the steps of FIG. 5A.

FIGS. 8A-8D illustrate methods for determining in-ear status of audio devices according to embodiments of the present disclosure. The devices 110a/110b begin in a sleep state (802), which may correspond to the out-of-ear status. The acceleration sensor 402 may sense acceleration greater than an acceleration threshold in an x-direction (804), a y-direction (806), and/or a z-direction (808). Once acceleration in one of the directions is determined, the acceleration sensor circuitry 408 sends (8102) an interrupt to the processor 214a, which may be in a sleep state. The acceleration sensor 402 enters (814) a low-power mode and sends (816) its status to the processor 214a in response to a request from the processor 214a.

The contact sensor 404 wakes (818) into a first power mode, which may be a low-power or "doze" mode in which the contact sensor 404 collects contact data at a first, lower resolution. If the contact sensor circuitry 410 determines (820) that the contact sensor 404 has sensed contact below a contact threshold, the processor 214a determines that the status of the devices 110a/110b is out-of-ear, and the devices 110a/110b enter a low-power or sleep state. If the contact sensor circuitry 410 determines (820) that the contact sensor 404 has sensed contact above a contact threshold, the contact sensor circuitry 410 sends (822) an interrupt to the processor 214a and enters (824) a second power mode; the second power mode in which the contact sensor 404 collects data at a second, higher resolution.

The processor 214a wakes (826) the proximity sensor 406. If the proximity sensor circuitry 412 determines (828) that the proximity sensor 406 has sensed infrared below an infrared threshold, the method returns to the step (820) of checking for detection of the contact threshold. If the proximity sensor circuitry 412 determines (828) that the proximity sensor 406 has sensed infrared above an infrared threshold, the proximity sensor circuitry 412 sends (830) an interrupt to the processor 214a and sends (832) a detect event—e.g., an indication of the detection and/or infrared data corresponding to the detection—to the processor 214a.

The processor 214a enables (834) a high-accuracy mode of the acceleration sensor 402 corresponding to collection of orientation data that includes both position and rotational information. The acceleration sensor 402 determines (836) the six-dimensional orientation of the device 110a/110b and the acceleration sensor circuitry 408 sends (838) an interrupt to the processor 214a and sends (840) the orientation data to the processor 214a. The processor 214a may, as described above, also receive orientation data from the second device 110b. If the processor 214a determines (842) that the orientation data of the devices 110a/110b corresponds to an out-of-ear orientation (in accordance with the disclosure of FIG. 5B or FIG. 5C), the method returns to the step of determining 828 if the infrared data is greater than a threshold. If the processor 214a determines (842) that the orientation data corresponds to an in-ear orientation (in accordance with the disclosure of FIG. 5B or FIG. 5C, the processor 214a determines (844) that the status of the device 110a/110b is in-ear.

Figure 9:
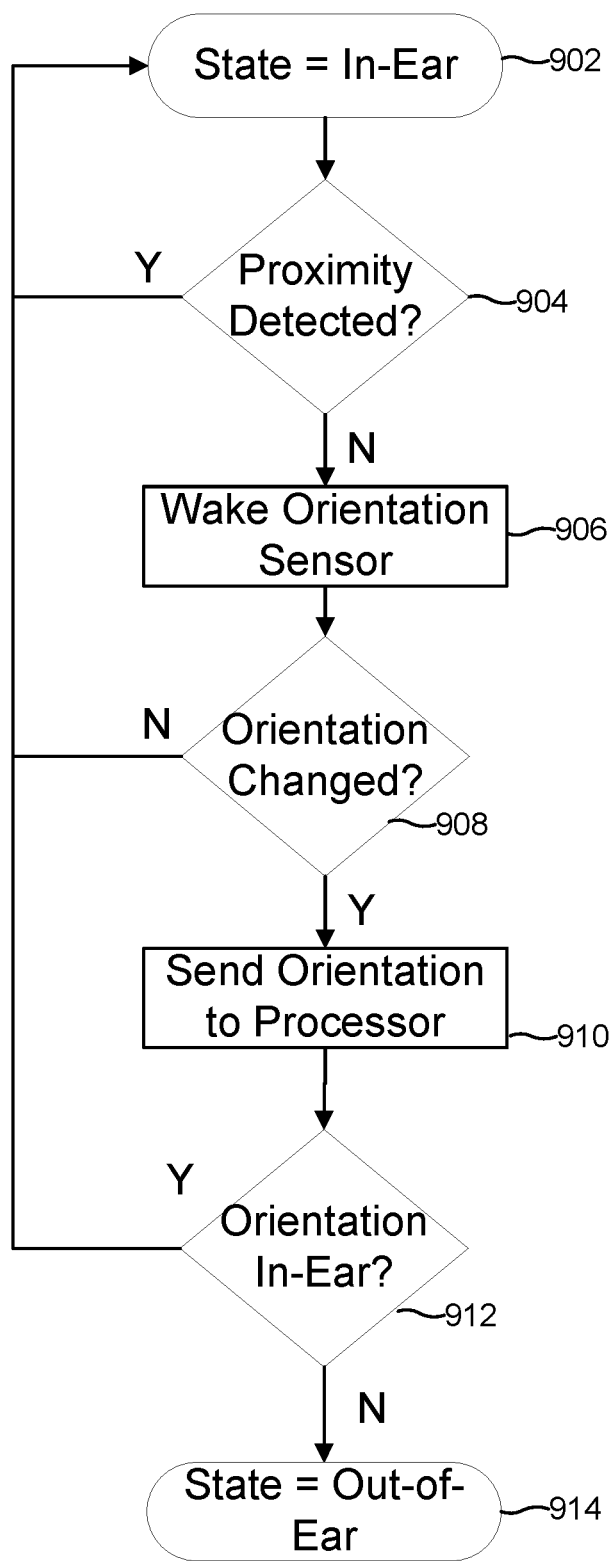
FIG. 9 illustrates a method for determining out-of-ear status of audio devices according to embodiments of the present disclosure.

FIG. 9 is a diagram of a method for determining out-of-ear status of an audio device according to embodiments of the present disclosure. The device 110a/110b begins in the in-ear state (902), as described above. If the processor 214a determines (904) that proximity is detected, the processor 214a maintains the in-ear status of the device 110a/110b. If the processor 214a determines (904) that proximity not is detected, the processor 214a wakes (906) the orientation sensor 402. Detection of the proximity may correspond to a different threshold than the threshold used in determining the in-ear status; in some embodiments, the threshold for proximity for determining out-of-ear status is 10-20 mm.

If the orientation sensor 402 and the orientation sensor circuitry 408 determine (908) that the orientation of the device 110a/110b has changed, the orientation sensor circuitry 408 sends (910) the updated orientation data to the processor 214a. If the processor 214a determines (91)2 that the updated orientation data corresponds to an in-ear orientation, the processor 214a maintains the in-ear status 902. If the processor 214a determines (912) that the updated orientation data corresponds to an out-of-ear orientation, the processor 214a sets (914) the status of the device 110a/110b to out-of-ear. Like detection of the wireless network during determining of the in-ear status, if disconnection of the wireless network is determined during any point of the method of FIG. 9, the processor 214a may assign the out-of-ear status to the device 110a/110b based thereon.

Figure 10:
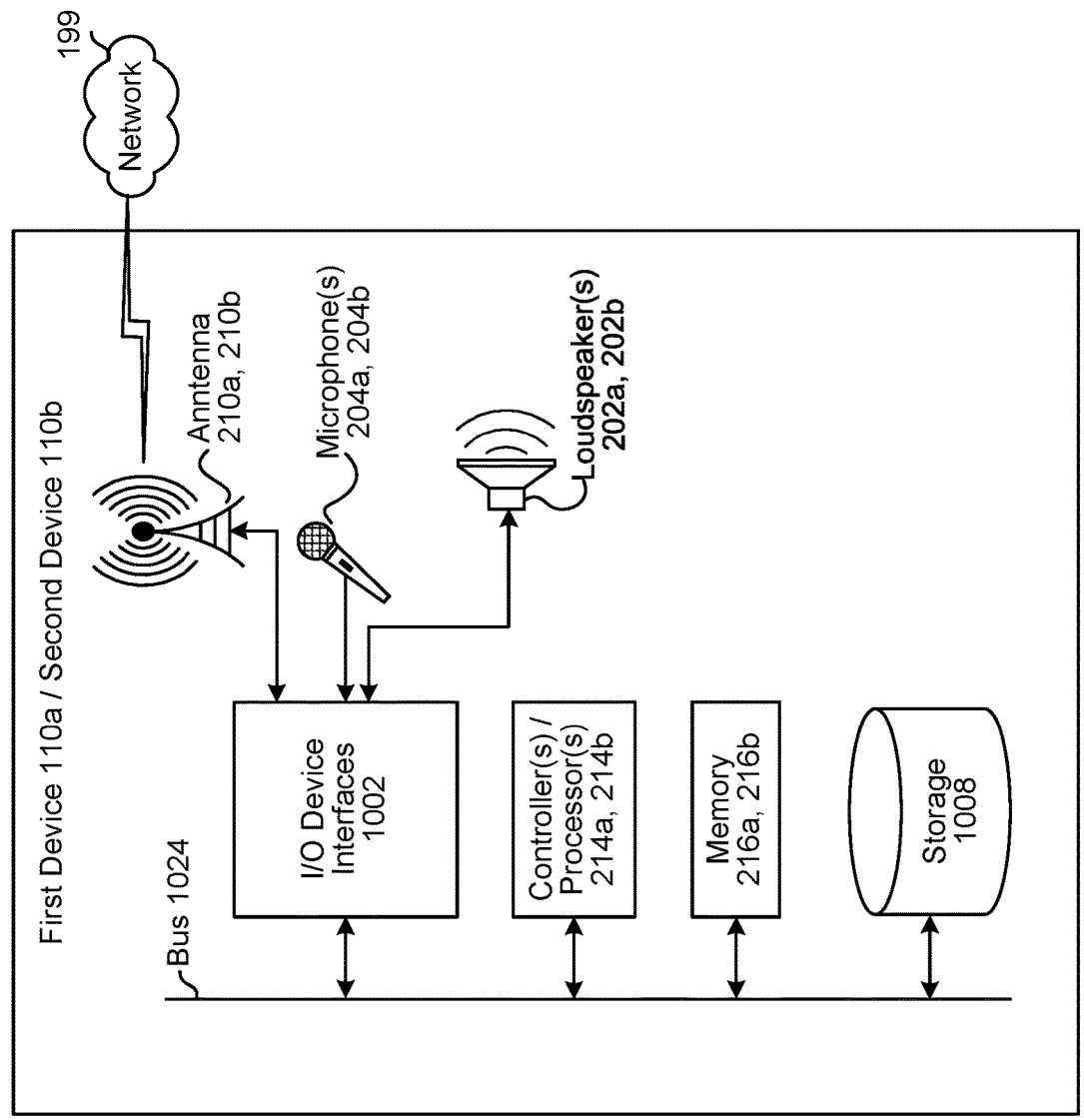
FIG. 10 illustrates example audio devices according to embodiments of the present disclosure.

FIG. 10 is a block diagram conceptually illustrating a first device 110a or second device 110b that may be used with the described system. Each of these devices 110a/110b may include one or more controllers/processors 214, which may each include a central processing unit (CPU) for processing data and computer-readable instructions and a memory 216 for storing data and instructions of the respective device. The memory 216 may individually include volatile random-access memory (RAM), non-volatile read-only memory (ROM), non-volatile magnetoresistive (MRAM) memory, and/or other types of memory. Each device may also include a data-storage component 1008 for storing data and controller/processor-executable instructions. Each data-storage component 1008 may individually include one or more non-volatile storage types such as magnetic storage, optical storage, solid-state storage, etc. Each device may also be connected to removable or external non-volatile memory and/or storage (such as a removable memory card, memory key drive, networked storage, etc.) through respective input/output device interfaces 1002.

Computer instructions for operating each device 110a/110b and its various components may be executed by the respective device's controller(s)/processor(s) 214, using the memory 216 as temporary "working" storage at runtime. A device's computer instructions may be stored in a non-transitory manner in non-volatile memory 216, storage 1008, or an external device(s). Alternatively, some or all of the executable instructions may be embedded in hardware or firmware on the respective device in addition to or instead of software.

Each device 110a/110b includes input/output device interfaces 1002. A variety of components may be connected through the input/output device interfaces, as will be discussed further below. Additionally, each device 110a/110b may include an address/data bus 1024 for conveying data among components of the respective device. Each component within a device 110a/110b may also be directly connected to other components in addition to (or instead of) being connected to other components across the bus 1024.

For example, via the antenna 210, the input/output device interfaces may connect to one or more networks 199 via a wireless local area network (WLAN) (such as Wi-Fi) radio, Bluetooth, and/or wireless network radio, such as a radio capable of communication with a wireless communication network such as a Long Term Evolution (LTE) network, WiMAX network, 3G network, etc. A wired connection such as Ethernet may also be supported. Through the network(s) 199, the speech processing system may be distributed across a networked environment.

The device 110a/110b may also include an audio capture component which may be, for example, a microphone 204/205 or array of microphones. The microphones 204/205 may be configured to capture audio. The microphones 204/205 may be used to determine an approximate distance to a sound's point of origin; acoustic localization, based on time and/or amplitude differences between sounds captured by different microphones of the array, i.e., beam forming, may be performed. The device 110a/110b (using microphone 204/205, wakeword detection, automatic speech recognition, etc.) may be configured to determine audio data corresponding to detected audio. The device 110a/110b (using input/output device interfaces, antenna 210, etc.) may also be configured to transmit the audio data to a user device 112 and/or remote device 120 for further processing or to process the data using internal components such as a wakeword detection module. As a way of indicating to a user that a wireless connection to another device has been created, the device 110a/110b may be configured with a visual indicator, such as an LED or similar component (not illustrated), that may change color, flash, or otherwise provide visual indications by the device 110a/110b.

Figure 11:
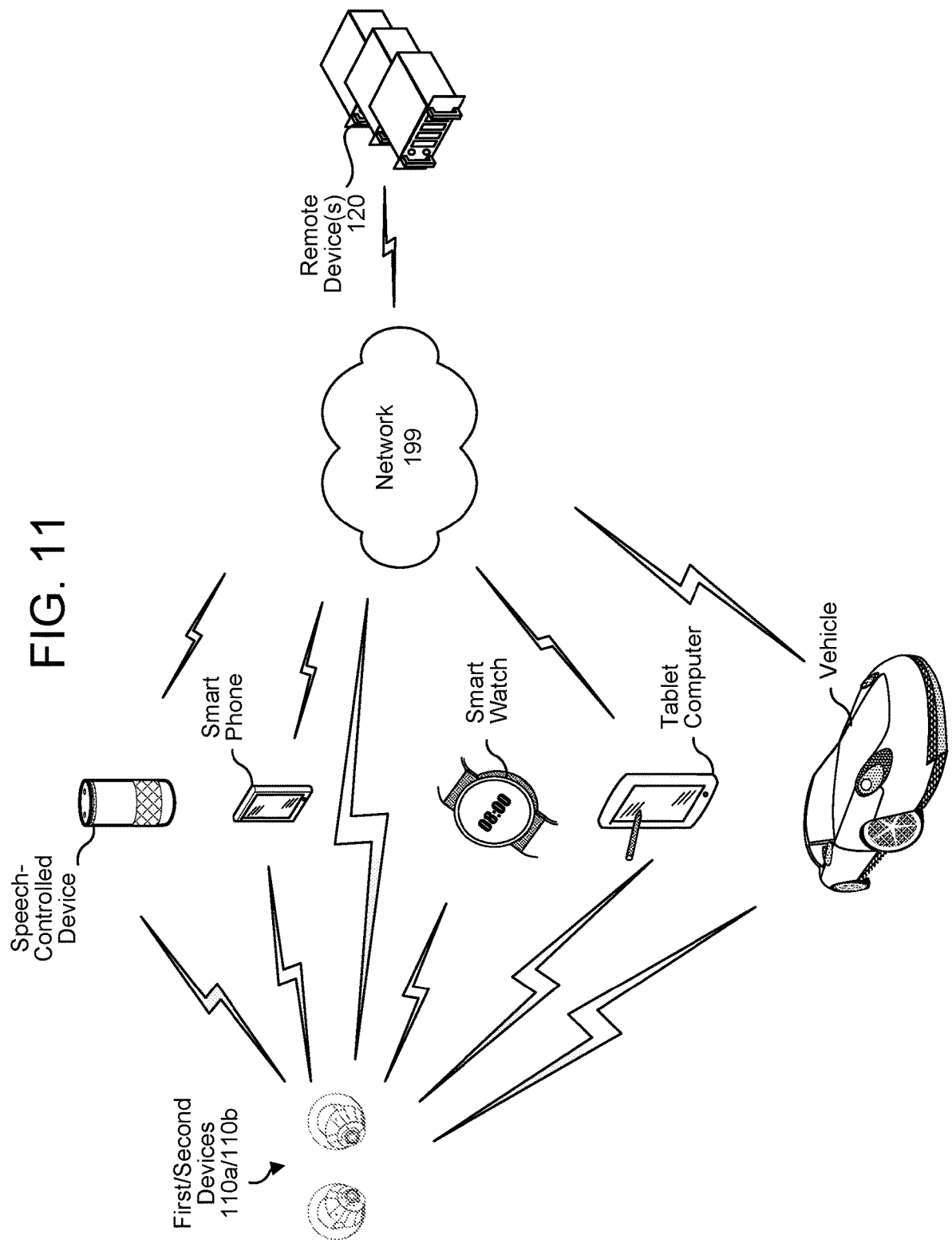
FIG. 11 illustrates an example of a computer network for use with audio devices according to embodiments of the present disclosure.

As illustrated in FIG. 11 multiple devices may contain components of the system and the devices may be connected over a network 199. The network 199 may include one or more local-area or private networks and/or a wide-area network, such as the internet. Local devices may be connected to the network 199 through either wired or wireless connections. For example, a speech-controlled device, a tablet computer, a smart phone, a smart watch, and/or a vehicle may be connected to the network 199. One or more remote device(s) 120 may be connected to the network 199 and may communicate with the other devices therethrough. Headphones 110a/110b may similarly be connected to the remote device(s) 120 either directly or via a network connection to one or more of the local devices.

The above aspects of the present disclosure are meant to be illustrative and were chosen to explain the principles and application of the disclosure; they are not intended to be exhaustive or to limit the disclosure. Many modifications and variations of the disclosed aspects may be apparent to those of skill in the art. Persons having ordinary skill in the field of computers, wearable devices, and speech processing will recognize that components and process steps described herein may be interchangeable with other components or steps, or combinations thereof, and still achieve the benefits and advantages of the present disclosure. Moreover, it will be apparent to one skilled in the art that the disclosure may be practiced without some or all of the specific details and steps disclosed herein. As the term is used herein, "component" may be interchanged with similar terms, such as "module" or "engine."

Aspects of the disclosed system may be implemented as a computer method or as an article of manufacture, such as a memory device or non-transitory computer readable storage medium. The computer-readable storage medium may be readable by a computer and may comprise instructions for causing a computer or other device to perform processes described in the present disclosure. The computer-readable storage medium may be implemented by a volatile computer memory, non-volatile computer memory, hard drive, solid-state memory, flash drive, removable disk, and/or other media. In addition, components of system may be implemented in firmware and/or hardware, such as an acoustic front end (AFE), which comprises, among other things, analog and/or digital filters (e.g., filters configured as firmware to a digital signal processor (DSP)).

Conditional language used herein, such as, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements, and/or steps are in any way required for one or more embodiments or that one or more embodiments necessarily include logic for deciding, with or without other input or prompting, whether these features, elements, and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method comprising:
   determining, that a first device is proximate to a first portion of a user's body;
   receiving, by the first device from a second device, an indication that the second device is proximate to a second portion of the user's body;
   determining, by the first device, first data corresponding to a first orientation of the first device;
   receiving, by the first device from the second device, second data corresponding to a second orientation of the second device;
   determining, by the first device and using the first data, that the first orientation corresponds to a first upright orientation;
   determining, by the first device and using the second data, that the second orientation corresponds to a second upright orientation;
   based at least in part on determining that the first orientation corresponds to the first upright orientation and the second orientation corresponds to the second upright orientation, determining that the first orientation corresponds to a first ear of the user and that the second orientation corresponds to a second ear of the user; and
   outputting, using the first device, audio representing that the first orientation corresponds to the first ear and that the second orientation corresponds to the second ear.

2. The computer-implemented method of claim 1, further comprising:
   determining, using the first data and the second data, that a first loudspeaker of the first device and a second loudspeaker of the second device correspond to an in-ear orientation.

3. The computer-implemented method of claim 1, further comprising:
   before determining the first data, determining that a period of time corresponding to inserting the second device in an ear has elapsed after determining that the first device is proximate the first portion.

4. The computer-implemented method of claim 1, wherein determining that the first device is proximate to the first portion further comprises:
   receiving, from a first sensor, first sensor data indicating that the first device is in motion;
   receiving, from a second sensor, second sensor data indicating that the first device is in contact with the user's body; and
   receiving, from a third sensor, third sensor data indicating that the first device is proximate the first portion.

5. The computer-implemented method of claim 4, further comprising:
   based at least in part on the first sensor data, activating the second sensor; and
   based at least in part on the second sensor data, activating the third sensor.

6. The computer-implemented method of claim 4, wherein:
   the first sensor comprises an accelerometer,
   the second sensor comprises a capacitive touch sensor, and
   the third sensor comprises an infrared proximity sensor.

7. The computer-implemented method of claim 1, further comprising:
   after outputting the audio, determining third data corresponding to a third orientation of the first device;
   determining that the third orientation does not correspond to the first ear of the user;

determining, using an infrared sensor, that the first device is proximate to the first portion;
determining fourth data corresponding to a fourth orientation of the first device;
determining that the fourth orientation corresponds to the first ear of the user; and
outputting the audio.

8. The computer-implemented method of claim 1 wherein outputting the audio is based further in part on determining that the first device is communicatively coupled to the second device.

9. The computer-implemented method of claim 1, further comprising:
determining third data corresponding to a third orientation of the first device;
receiving, from the second device, fourth data corresponding to a fourth orientation of the second device;
determining, using the third data and the fourth data, that the third orientation corresponds to the first ear and that the fourth orientation corresponds to a first ear of a second user; and
outputting, using the first device, the audio.

10. A system comprising:
at least one processor; and
at least one memory including instructions that, when executed by the at least one processor, cause the system to:
determine that a first device is proximate to a first portion of a user's body;
receive, by the first device from a second device, an indication that the second device is proximate to a second portion of the user's body;
determine, by the first device, first data corresponding to a first orientation of the first device;
receive, by the first device from the second device, second data corresponding to a second orientation of the second device;
determine, by the first device and using the first data, that the first orientation corresponds to a first upright orientation;
determine, by the first device and using the second data, that the second orientation corresponds to a second upright orientation;
based at least in part on determining that the first orientation corresponds to the first upright orientation and the second orientation corresponds to the second upright orientation, determine that the first orientation corresponds to a first ear of the user and that the second orientation corresponds to a second ear of the user; and
output, using the first device, audio representing that the first orientation corresponds to the first ear and that the second orientation corresponds to the second ear.

11. The system of claim 10, wherein the at least one memory further comprises instructions that, when executed by the at least one processor, further cause the system to:
determine, using the first data and the second data, that a first loudspeaker of the first device and a second loudspeaker of the second device correspond to an in-ear orientation.

12. The system of claim 10, wherein the at least one memory further comprises instructions that, when executed by the at least one processor, further cause the system to:
before determining the first data, determine that a period of time corresponding to inserting the second device in an ear has elapsed after determining that the first device is proximate the first portion.

13. The system of claim 10, wherein the at least one memory further comprises instructions that, when executed by the at least one processor, further cause the system to:
receive, from a first sensor, first sensor data indicating that the first device in motion;
receive, from a second sensor, second sensor data indicating that the first device is in contact with the user's body; and
receive, from a third sensor, third sensor data indicating that the first device is proximate the first portion.

14. The system of claim 13, wherein the at least one memory further comprises instructions that, when executed by the at least one processor, further cause the system to:
based at least in part on the first sensor data, activate the second sensor; and
based at least in part on the second sensor data, activate the third sensor.

15. The system of claim 13, wherein:
the first sensor comprises an accelerometer,
the second sensor comprises a capacitive touch sensor, and
the third sensor comprises an infrared proximity sensor.

16. The system of claim 10, wherein the at least one memory further comprises instructions that, when executed by the at least one processor, further cause the system to:
after outputting the audio, determine third data corresponding to a third orientation of the first device;
determine that the third orientation does not correspond to the first ear of the user;
determine, using an infrared sensor, that the first device is proximate the first portion;
determine fourth data corresponding to a fourth orientation of the first device;
determine that the fourth orientation corresponds to the first ear of the user; and
output the audio.

17. The system of claim 10, wherein the at least one memory further comprises instructions to output the audio that, when executed by the at least one processor, further cause the system to:
determine that the first device communicatively coupled to the second device.

18. The system of claim 10, wherein the at least one memory further comprises instructions that, when executed by the at least one processor, further cause the system to:
determine third data corresponding to a third orientation of the first device;
receive, from the second device, fourth data corresponding to a fourth orientation of the second device;
determine, using the third data and the fourth data, that the third orientation corresponds to the first ear and that the fourth orientation corresponds to a first ear of a second user; and
output, using the first device, the audio.

* * * * *